(12) United States Patent
Dai et al.

(10) Patent No.: US 12,085,597 B2
(45) Date of Patent: Sep. 10, 2024

(54) FLEXIBLE SENSING SYSTEM, PROXIMITY SENSING METHOD AND APPARATUS, INTELLIGENT ROBOT, AND DEVICE

(71) Applicant: Tencent Technology (Shenzhen) Company Limited, Shenzhen (CN)

(72) Inventors: Yuan Dai, Shenzhen (CN); Peng Lu, Shenzhen (CN); Siyuan Liu, Shenzhen (CN); Ke Chen, Shenzhen (CN); Zhengyou Zhang, Shenzhen (CN); Chuanfei Guo, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 468 days.

(21) Appl. No.: 17/672,558

(22) Filed: Feb. 15, 2022

(65) Prior Publication Data

US 2022/0170974 A1 Jun. 2, 2022

Related U.S. Application Data

(63) Continuation of application No. PCT/CN2020/124945, filed on Oct. 29, 2020.

(30) Foreign Application Priority Data

Jan. 8, 2020 (CN) .......................... 202010016792.7

(51) Int. Cl.
*G01R 29/12* (2006.01)
*B25J 13/08* (2006.01)

(52) U.S. Cl.
CPC ............ *G01R 29/12* (2013.01); *B25J 13/086* (2013.01)

(58) Field of Classification Search
CPC . B25J 13/08; B25J 13/086; B25J 19/02; B25J 19/027; G01R 29/00; G01R 29/12; G01D 5/12; G01D 5/14; G01D 5/24
See application file for complete search history.

(56) References Cited

U.S. PATENT DOCUMENTS

| 2004/0181141 A1 | 9/2004 | Kislov et al. | |
| 2008/0174321 A1* | 7/2008 | Kang | ................... G06F 3/0446 |
| | | | 257/532 |

(Continued)

FOREIGN PATENT DOCUMENTS

| CN | 1212504 A | 3/1999 |
| CN | 101018046 A | 8/2007 |

(Continued)

OTHER PUBLICATIONS

Tencent Technology, ISR, PCT/CN2020/124945, Jan. 11, 2021, 3 pgs.

(Continued)

*Primary Examiner* — Huy Q Phan
*Assistant Examiner* — David B Frederiksen
(74) *Attorney, Agent, or Firm* — Morgan, Lewis & Bockius LLP

(57) ABSTRACT

This application discloses a flexible sensing system and an associated proximity sensing method. The flexible sensing system includes: a first thin film encapsulation layer and a first electrode layer attached to the first thin film encapsulation layer; the first electrode layer includes a bipolar electrode configured for forming an arc-shaped electric field for determining whether a distance between a target object and the sensing system is within the first distance range; the first electrode layer further includes a unipolar electrode configured for forming a vertical electric field for determining whether a distance between the target object and the sensing system is within the second distance range; and the (Continued)

first distance range is less than the second distance range. By using different sensing solutions for the object at different distance positions, the sensing system avoids the issue that a single sensing solution has a relatively low sensing accuracy.

14 Claims, 13 Drawing Sheets

(56) References Cited

U.S. PATENT DOCUMENTS

2013/0271161 A1* 10/2013 Solven ............... G06F 3/0445 324/661
2019/0170676 A1* 6/2019 Mamigonians ...... G01N 27/228

FOREIGN PATENT DOCUMENTS

| CN | 104764481 A | 7/2015 |
|---|---|---|
| CN | 105793869 A | 7/2016 |
| CN | 107677296 A | 2/2018 |
| CN | 108731849 A | 11/2018 |
| CN | 109163824 A | 1/2019 |
| CN | 109489697 A | 3/2019 |
| CN | 109813467 A | 5/2019 |
| CN | 110166012 A | 8/2019 |
| CN | 110212884 A | 9/2019 |
| CN | 110243396 A | 9/2019 |
| CN | 110806223 A | 2/2020 |
| JP | 2008159538 A | 7/2008 |
| JP | 2017173028 A | 9/2017 |
| WO | WO 2018150018 A1 | 8/2018 |
| WO | WO 2019042784 A1 | 3/2019 |

OTHER PUBLICATIONS

Tencent Technology, WO, PCT/CN2020/124945, Jan. 11, 2021, 5 pgs.

Tencent Technology, IPRP, PCT/CN2020/124945, Jul. 12, 2022, 6 pgs.

* cited by examiner

FLEXIBLE SENSING SYSTEM, PROXIMITY SENSING METHOD AND APPARATUS, INTELLIGENT ROBOT, AND DEVICE

CROSS-REFERENCE TO RELATED APPLICATIONS

This application is a continuation application of PCT Patent Application No. PCT/CN2020/124945, entitled "FLEXIBLE SENSING SYSTEM, PROXIMITY SENSING METHOD AND APPARATUS, SMART ROBOT, AND DEVICE" filed on Oct. 29, 2020, which claims priority to Chinese Patent Application No. 202010016792.7, filed with the State Intellectual Property Office of the People's Republic of China on Jan. 8, 2020, and entitled "FLEXIBLE SENSING SYSTEM, PROXIMITY SENSING METHOD AND APPARATUS, INTELLIGENT ROBOT, AND DEVICE", all of which are incorporated herein by reference in their entirety.

FIELD OF THE TECHNOLOGY

Embodiments of this application relate to the field of sensor design, and in particular, to a flexible sensing system, a proximity sensing method and apparatus, an intelligent robot, and a device.

BACKGROUND OF THE DISCLOSURE

With the development of intelligent robot technologies and the deepening of intelligent robot application scenarios, an intelligent robot further needs to sense and feedback an external environment in addition to completing set mechanical actions. Generally, the intelligent robot senses an object by mounting a proximity sensor on the intelligent robot.

In the related technology, an infrared sensor, a laser sensor, or an ultrasonic sensor serving as the proximity sensor is disposed on the intelligent robot, to determine a distance between an object and the proximity sensor through signal receiving and sending.

However, when the object is sensed in the foregoing manner, because the foregoing proximity sensor has a relatively simple sensing principle, when sensing a distance between the object and the intelligent robot, the proximity sensor has a relatively large detection range and relatively low detection precision. Therefore, the proximity sensor has a relatively low sensing accuracy.

SUMMARY

Embodiments of this application provide a flexible sensing system, a proximity sensing method and apparatus, an intelligent robot, and a device, to improve the sensing accuracy of a proximity sensor. The technical solutions are as follows:

In an aspect, a flexible sensing system is provided, the method including:
  a first thin film encapsulation layer and a first electrode layer attached to the first thin film encapsulation layer;
  the first electrode layer comprising a bipolar electrode having dual polarities, wherein the bipolar electrode is configured to, when a target object approaches the flexible sensing system, form an arc-shaped electric field for determining whether a distance between the target object and the flexible sensing system is within a first distance range;
  the first electrode layer further comprising a unipolar electrode having a single polarity, wherein the unipolar electrode in configured to, when the target object approaches the flexible sensing system, form a vertical electric field for determining whether the distance between the target object and the flexible sensing system is within a second distance range; and
  the first distance range being less than the second distance range.

In another aspect, a proximity sensing method is performed by a computer device in connection with the aforementioned flexible sensing system, the method including:
  obtaining near-field channel data acquired through the bipolar electrode of the flexible sensing system;
  obtaining, when the near-field channel data does not meet a near-field data requirement, far-field channel data acquired through the unipolar electrode of the flexible sensing system, the near-field data requirement being a data requirement determined according to the first distance range; and
  determining a distance between the target object and the flexible sensing system by using the far-field channel data.

In another aspect, an intelligent robot is provided, the intelligent robot including the flexible sensing system involved in the foregoing embodiments of this application being attached to a preset position on a surface of the intelligent robot.

In another aspect, a computer device is provided, including a processor and a memory, the memory storing at least one instruction, the at least one instruction, when being loaded and executed by the processor, causing the computer device to implement the proximity sensing method involved in the foregoing embodiments of this application.

In another aspect, a non-transitory computer-readable storage medium is provided, the computer-readable storage medium including computer instructions stored therein. A processor of a computer device reads the computer instructions from the computer-readable storage medium, and the processor executes the computer instructions, to cause the computer device to perform any proximity sensing method in the foregoing embodiments.

The technical solutions provided in the embodiments of this application achieve at least the following beneficial effects:

Two different electrodes: a unipolar electrode and a bipolar electrode are disposed on a first electrode layer, a distance between a target object within a near distance range and a flexible sensing system is determined by using the bipolar electrode, and a distance between the target object within a far distance range and the flexible sensing system is determined by using the unipolar electrode. Therefore, different sensing solutions are used for the object at different distance positions, thereby avoiding that a single sensing solution has a relatively low sensing accuracy, and improving the sensing accuracy of the proximity sensor.

BRIEF DESCRIPTION OF THE DRAWINGS

To describe the technical solutions in embodiments of this application more clearly, the following briefly introduces the accompanying drawings required for describing the embodiments. Apparently, the accompanying drawings in the following description show only some embodiments of this application, and a person of ordinary skill in the art may still derive other accompanying drawings from the accompanying drawings without creative efforts.

DESCRIPTION OF EMBODIMENTS

To make objectives, technical solutions, and advantages of this application clearer, the following further describes implementations of this application in detail with reference to the accompanying drawings.

First, terms involved in embodiments of this application are briefly introduced.

Proximity sensor: a sensor device capable of sensing the proximity of an object. In this embodiment of this application, description is made by using a capacitive proximity sensor as an example. An electrode is used as a detection end in the capacitive proximity sensor. Generally, there is a specific capacity between the electrode and an environment. When an object approaches the electrode, the electrode is subject to electrostatic induction to generate polarization. Therefore, an electrode capacitance changes, and an approaching degree to the object may be determined according to a change of the electrode capacitance.

In this embodiment of this application, description is made by using an example in which a unipolar electrode and a bipolar electrode are provided in the proximity sensor. The unipolar electrode is an electrode including a single polarity. In some embodiments, the unipolar electrode includes a positive electrode, or the unipolar electrode includes a negative electrode. In some embodiments, the unipolar electrode includes at least one pin. The bipolar electrode is an electrode including dual polarities. In some embodiments, the bipolar electrode includes a positive electrode and a negative electrode, and the bipolar electrode includes at least two pins. The unipolar electrode is used for forming a vertical electric field, and a distance and an orientation of the object are determined by using the vertical electric field, the distance being used for representing a distance between the object and the proximity sensor, the orientation being used for representing a position of the object relative to the proximity sensor; and the bipolar electrode is used for forming an arc-shaped electric field, and a distance and an orientation of the object are determined by using the arc-shaped electric field.

The arc-shaped electric field is used for determining a distance and an orientation of a target object within a first distance range, the vertical electric field is used for determining a distance and an orientation of the target object within a second distance range, and the first distance range is less than the second distance range.

Figure 1:
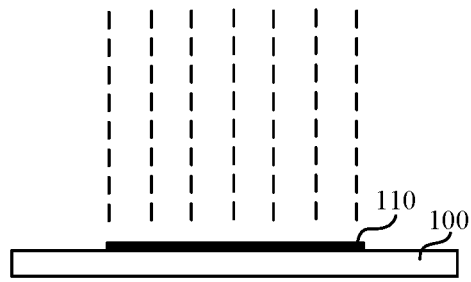
FIG. 1 is a schematic diagram of a vertical electric field formed by a unipolar electrode according to an exemplary embodiment of this application.
Figure 2:
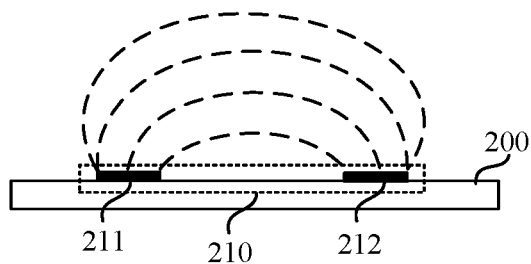
FIG. 2 is a schematic diagram of an arc-shaped electric field formed by a bipolar electrode according to an exemplary embodiment of this application.

Exemplarily, the arc-shaped electric field corresponding to the bipolar electrode and the vertical electric field corresponding to the unipolar electrode are separately described with reference to the accompanying drawings. Referring to FIG. 1 and FIG. 2, FIG. 1 is a schematic diagram of a vertical electric field formed by a unipolar electrode according to an exemplary embodiment of this application. As shown in FIG. 1, a unipolar electrode 110 is provided on a proximity sensor 100, and the unipolar electrode 110 forms a vertical electric field in a vertical direction, where the unipolar electrode 110 is represented a positive electrode, or the unipolar electrode 110 is represented a negative electrode. FIG. 2 is a schematic diagram of an arc-shaped electric field formed by a bipolar electrode according to an exemplary embodiment of this application. As shown in FIG. 2, a bipolar electrode 210 is provided on a proximity sensor 200, and includes a pin 211 and a pin 212, and an arc-shaped electric field is formed between the pin 211 and the pin 212. In some embodiments, in the bipolar electrode 210, the pin 211 is represented as a positive electrode, and the pin 212 is represented as a negative electrode; or the pin 211 is represented as a negative electrode, and the pin 212 is represented as a positive electrode.

Figure 3:
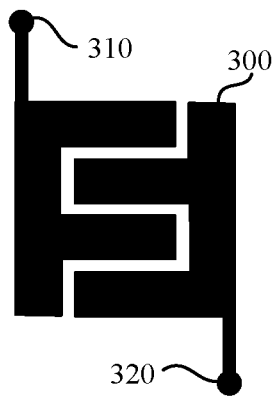
FIG. 3 is a schematic structural diagram of an interdigital bipolar electrode according to an exemplary embodiment of this application.
Figure 4:
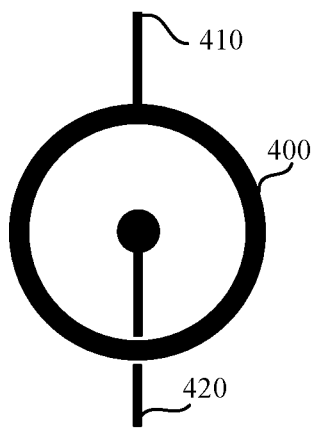
FIG. 4 is a schematic structural diagram of a concentric electrode according to an exemplary embodiment of this application.

In some embodiments, the bipolar electrode is implemented as an interdigital bipolar electrode or a concentric electrode. Exemplarily, FIG. 3 is a schematic structural diagram of an interdigital bipolar electrode according to an exemplary embodiment of this application. As shown in FIG. 3, the interdigital bipolar electrode 300 includes a pin 310 and a pin 320, where the pin 310 is represented as a positive electrode, and the pin 320 is represented as a negative electrode; or the pin 310 is represented as a negative electrode, and the pin 320 is represented as a positive electrode. FIG. 4 is a schematic structural diagram of a concentric electrode according to an exemplary embodiment of this application. As shown in FIG. 4, the concentric electrode 400 includes a pin 410 and a pin 420, where the pin 410 is represented as a positive electrode, and the pin 420 is represented as a negative electrode; or the pin 410 is represented as a negative electrode, and the pin 420 is represented as a positive electrode.

Contact sensor: It is also referred to as a tactile sensor, and is a sensor that detects a position and a pressure value of a pressure event generated by an object on a sensor surface. In this embodiment of this application, description is made by using an example in which the contact sensor is implemented by superimposing a first electrode layer, a dielectric layer, and a second electrode layer. The dielectric layer is located between the first electrode layer and the second electrode layer, a contact sensing electric field is formed between the first electrode layer and the second electrode layer, the contact sensing electric field is approximated as a parallel electric field, a dielectric constant of an electrode material is not changed during sensing, and an area of overlap between the first electrode layer and the second electrode layer is not changed either. Therefore, when a capacitive sensor is subjected to a pressure event, a distance between the first electrode layer and the second electrode layer decreases, to correspondingly increase a capacitance value, and the pressure event may be sensed according to a change of the capacitance value.

Figure 5:
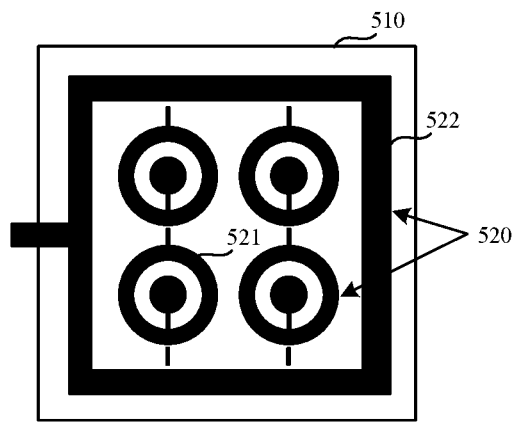
FIG. 5 is a schematic structural diagram of a flexible sensing system according to an exemplary embodiment of this application.

The flexible sensing system involved in the embodiments of this application is described with reference to the description of the foregoing terms. FIG. 5 is a schematic structural diagram of a flexible sensing system according to an exemplary embodiment of this application. As shown in FIG. 5, the flexible sensing system includes a first thin film encapsulation layer 510 and a first electrode layer 520 that are sequentially superimposed.

The first electrode layer 520 is attached to the first thin film encapsulation layer 510, and the first electrode layer 520 includes a bipolar electrode 521 and a unipolar electrode 522. The bipolar electrode 521 is an electrode including dual polarities, that is, the bipolar electrode 521 includes a positive electrode and a negative electrode. When a target object approaches the flexible sensing system, an arc-shaped electric field formed by the bipolar electrode 521 is used for determining a distance between the target object and the flexible sensing system within a first distance range. In some embodiments, the arc-shaped electric field is further used for determining an orientation of the target object. The unipolar electrode 522 is an electrode including a single polarity, and the unipolar electrode 522 includes a positive electrode, or the unipolar electrode 522 includes a negative electrode. When the target object approaches the flexible sensing system, a vertical electric field formed by the unipolar electrode 522 is used for determining a distance between the target object and the flexible sensing system within a second distance range. In some embodiments, the vertical electric field is further used for determining an orientation of the target object. The first distance range is less than the second distance range, that is, a value of a distance within the first distance range is less than a value of a distance within the second distance range. That the foregoing target object approaches the flexible sensing system means that the distance between the target object and the flexible sensing system falls within the first distance range or the second distance range. That is, when a position of the target object can affect a capacitance of the electrode in the flexible sensing system, it is determined that the target object approaches the flexible sensing system.

In some embodiments, the first electrode layer 520 may be attached to the first thin film encapsulation layer 510 in an attachment manner, or be attached to the first thin film encapsulation layer 510 in an evaporation or printing manner, or be attached to the first thin film encapsulation layer 510 in a spraying manner. This is not limited in this embodiment of this application.

In some embodiments, there may be one or more bipolar electrodes 521 implemented; and there may be one or more unipolar electrodes 522. This is not limited in this embodiment.

In some embodiments, when the first electrode layer 520 includes a plurality of bipolar electrodes 521, the plurality of bipolar electrodes 521 are all interdigital bipolar electrodes or concentric electrodes; or a part of the bipolar electrodes are implemented as interdigital bipolar electrodes, and the other part of the bipolar electrodes are implemented as concentric electrodes. This is not limited in this embodiment.

In summary, in the flexible sensing system provided in this embodiment, two electrodes: a unipolar electrode and a bipolar electrode are disposed on a first electrode layer, a distance between a target object within a first distance range and a flexible sensing system is determined by using the bipolar electrode, and a distance between the target object within a second distance range and the flexible sensing system is determined by using the unipolar electrode. Therefore, different sensing solutions are used for the object at different distance positions, thereby avoiding that a single sensing solution has a relatively low sensing accuracy, and improving the sensing accuracy of the proximity sensor.

In some embodiments, the foregoing first electrode layer 520 includes a bipolar electrode array including n bipolar electrodes 521, and n is a positive integer. The unipolar electrode 522 includes a frame-shaped unipolar electrode, and the bipolar electrode array falls within a hollow region of the frame-shaped unipolar electrode.

Figure 6:
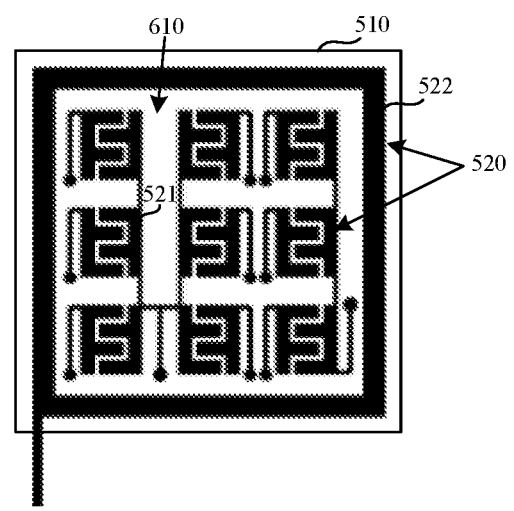
FIG. 6 is a schematic diagram of an arrangement structure of unipolar and bipolar electrodes according to an exemplary embodiment of this application.

Exemplarily, description is made by using the bipolar electrode array including 9 bipolar electrodes 521 in the first electrode layer 520 as an example. Referring to FIG. 6, 9 bipolar electrodes 521 arranged in an array are included within a hollow region 610 of a unipolar electrode 522 (a frame-shaped unipolar electrode). Description is made by using an example in which 9 bipolar electrodes 521 are all interdigital bipolar electrodes in FIG. 6. More or fewer bipolar electrodes 521 may be further included within the hollow region 610. Moreover, the bipolar electrodes 521 may alternatively be implemented as concentric electrodes; or a part of the bipolar electrodes are implemented as concentric electrodes, and the other part of the bipolar electrodes are implemented as interdigital bipolar electrodes. That is, n bipolar electrodes 521 include at least one interdigital bipolar electrode; or n bipolar electrodes 521 include at least one concentric electrode.

Description is made by using an example in which the frame-shaped unipolar electrode formed by the unipolar electrode 522 is a rectangular frame in FIG. 6. The frame-shaped unipolar electrode may alternatively be implemented as a circular frame, a triangular frame, a pentagonal frame, an irregular shape frame, or the like, which is not limited in this embodiment.

Electrode materials of the unipolar electrode and the bipolar electrode on the first electrode layer 520 include at least one of the following situations:

First, the first electrode layer 520 includes conductive carbon cloth as an electrode material, and the conductive carbon cloth is attached to the first thin film encapsulation layer 510.

Exemplarily, after the conductive carbon cloth is cut into a shape of the electrode through laser cutting, the conductive carbon cloth obtained through cutting is attached to the first thin film encapsulation layer 510. In some embodiments, a unipolar electrode, a bipolar electrode, or a unipolar electrode and a bipolar electrode may be obtained by cutting the conductive carbon cloth as the electrode material.

Second, the first electrode layer 520 includes a conductive metal as an electrode material, and the conductive metal is evaporated on the first thin film encapsulation layer 510.

Third, the first electrode layer 520 includes a silver nanowire as an electrode material, and the silver nanowire is sprayed on the first thin film encapsulation layer 510.

Fourth, the first electrode layer 520 includes a conductive metal as an electrode material, and the conductive metal is printed on the first thin film encapsulation layer 510 in a printing manner. In some embodiments, the first thin film encapsulation layer 510 is a thermoplastic polyurethanes (TPU) thin film.

The interdigital bipolar electrode and the concentric electrode are separately described.

Figure 7:
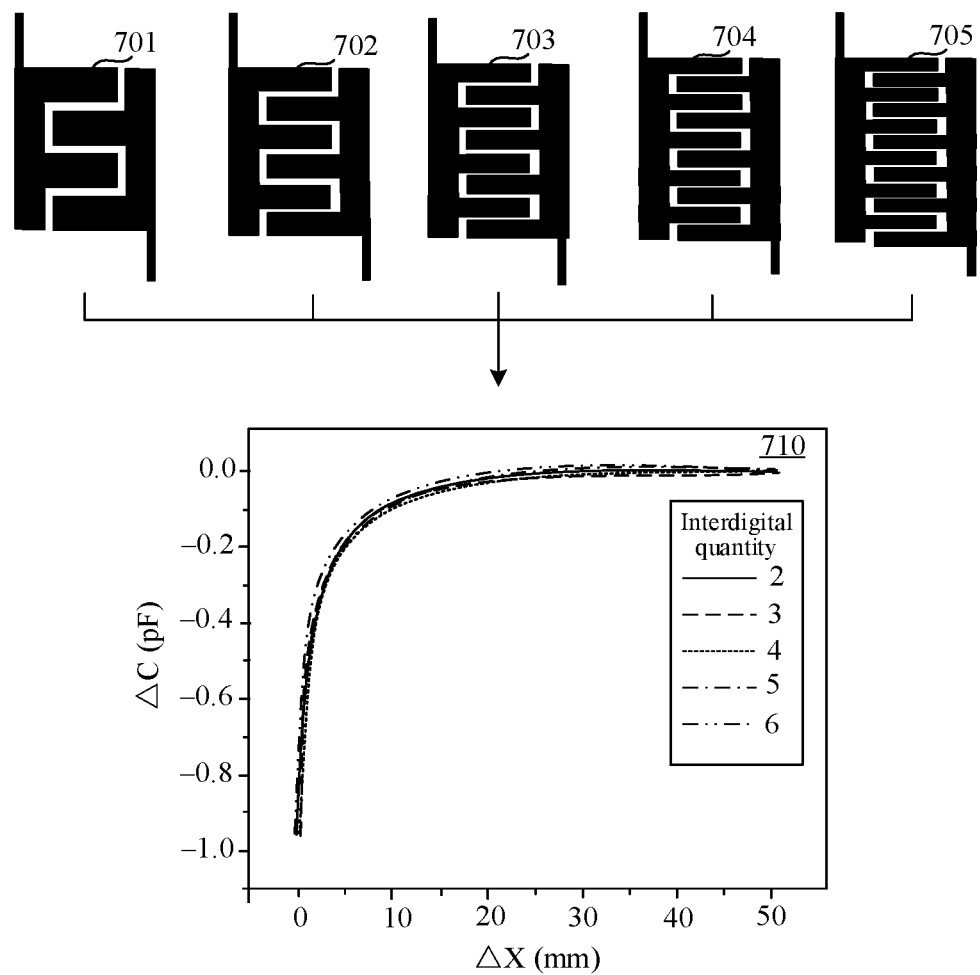
FIG. 7 is a schematic diagram of sensing performance when interdigital bipolar electrodes have different interdigital quantities according to an exemplary embodiment of this application.

First, the interdigital bipolar electrode is described as follows:

Exemplarily, an interdigital quantity of the interdigital bipolar electrode in FIG. 6 is 2. In an actual application, the interdigital quantity of the interdigital bipolar electrode may alternatively be 3, 4, 5, or the like. This is not limited in this embodiment of this application. For different interdigital quantities, the sensing performance of the interdigital bipolar electrodes is different. Exemplarily, referring to FIG. 7, an interdigital quantity of a bipolar electrode 701 is 2, an interdigital quantity of a bipolar electrode 702 is 3, an interdigital quantity of a bipolar electrode 703 is 4, an interdigital quantity of a bipolar electrode 704 is 5, and an interdigital quantity of a bipolar electrode 705 is 6, and the sensing performance of the bipolar electrode 701 to the bipolar electrode 705 is shown in a curve graph 710, where a horizontal coordinate of the curve graph 710 is used for representing a distance between an object and the bipolar electrode, and a vertical coordinate represents a capacitance variation of the bipolar electrode.

Figure 8:
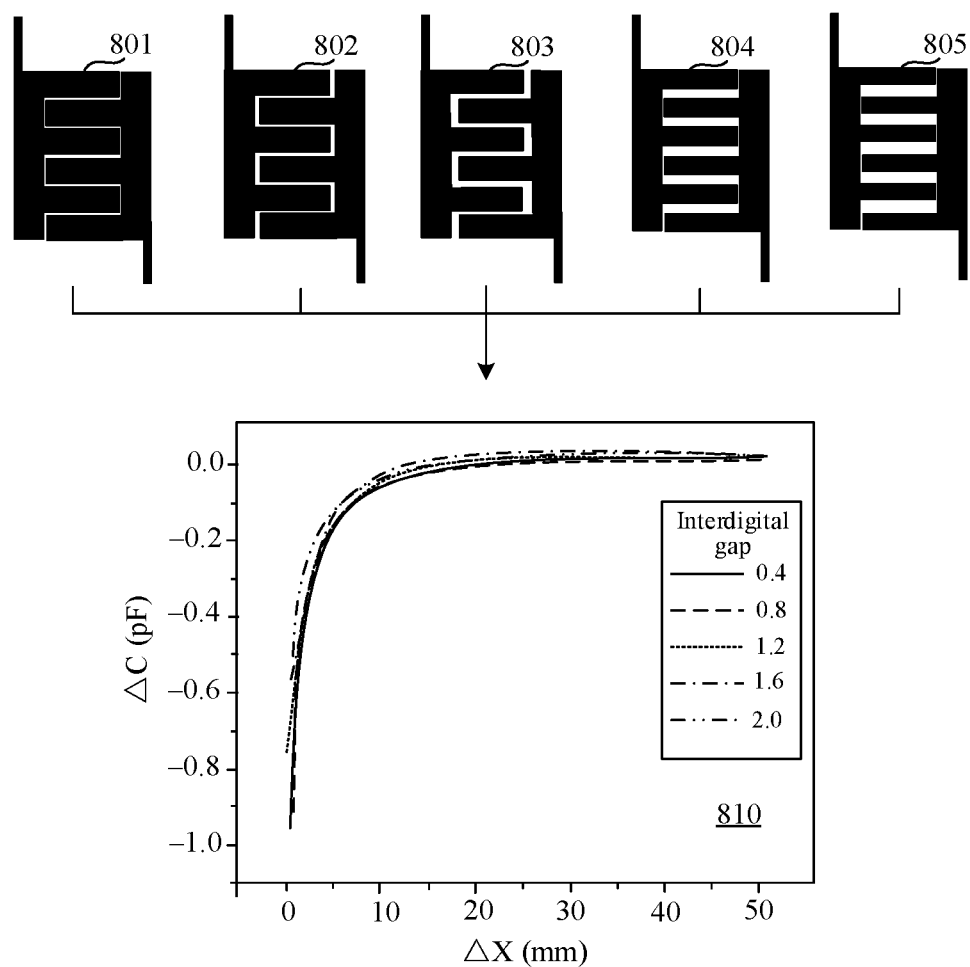
FIG. 8 is a schematic diagram of sensing performance when interdigital bipolar electrodes have different interdigital gaps according to an exemplary embodiment of this application.

When interdigital gaps of the interdigital bipolar electrodes are different, the corresponding sensing performance is also different. Exemplarily, referring to FIG. 8, interdigital gaps of a bipolar electrode 801 (an interdigital gap 0.4), a bipolar electrode 802 (an interdigital gap 0.8), a bipolar electrode 803 (an interdigital gap 1.2), a bipolar electrode 804 (an interdigital gap 1.6), and a bipolar electrode 805 (an interdigital gap 2.0) are sequentially increased, and the sensing performance of the bipolar electrode 801 to the bipolar electrode 805 is shown in a curve graph 810, where a horizontal coordinate of the curve graph 810 is used for representing a distance between an object and the bipolar electrode, and a vertical coordinate represents a capacitance variation of the bipolar electrode.

Figure 9:
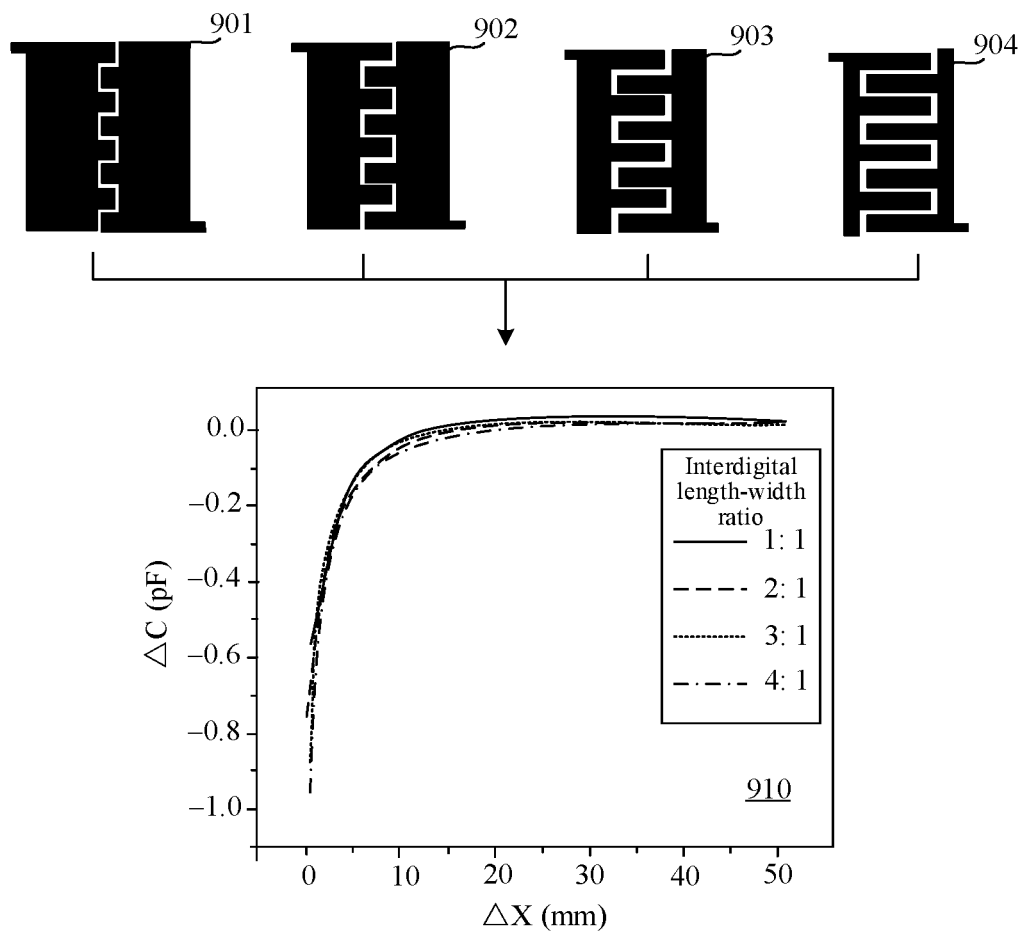
FIG. 9 is a schematic diagram of sensing performance when interdigital bipolar electrodes have different length-width ratios according to an exemplary embodiment of this application.

When interdigital length-width ratios of the interdigital bipolar electrodes are different, the corresponding sensing performance is also different. Exemplarily, referring to FIG. 9, interdigital length-width ratios of a bipolar electrode 901 (a length-width ratio 1:1), a bipolar electrode 902 (a length-width ratio 2:1), a bipolar electrode 903 (a length-width ratio 3:1), and a bipolar electrode 904 (a length-width ratio 4:1) are sequentially increased, and the sensing performance of the bipolar electrode 901 to the bipolar electrode 904 is shown in a curve graph 910, where a horizontal coordinate of the curve graph 910 is used for representing a distance between an object and the bipolar electrode, and a vertical coordinate represents a capacitance variation of the bipolar electrode.

Figure 10:
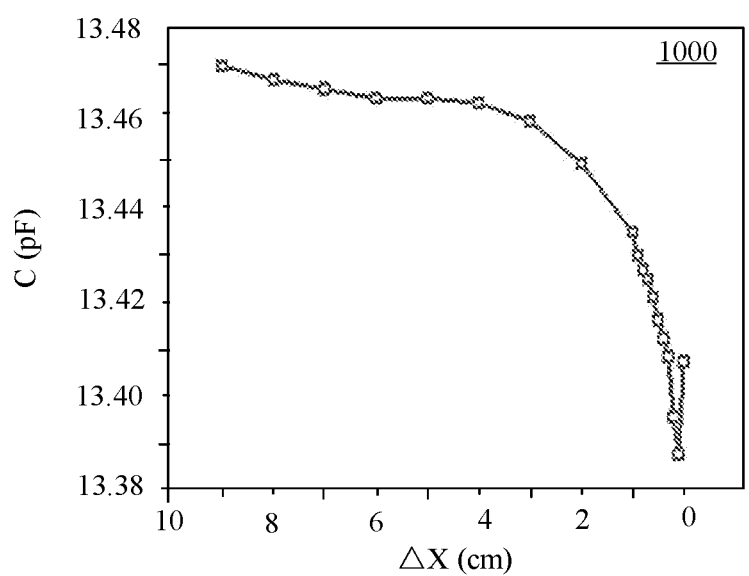
FIG. 10 is a schematic diagram of proximity sensing performance of an interdigital bipolar electrode on an insulator according to an exemplary embodiment of this application.
Figure 11:
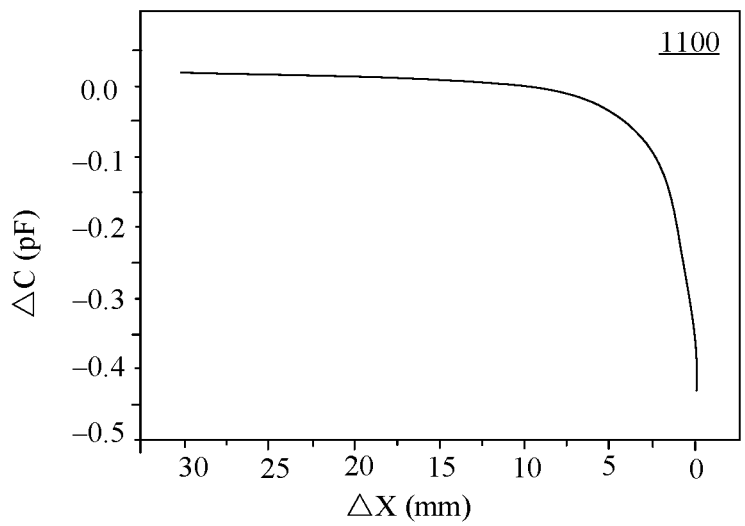
FIG. 11 is a schematic diagram of proximity sensing performance of an interdigital bipolar electrode on a conductor according to an exemplary embodiment of this application.

The interdigital bipolar electrodes have different proximity sensing performance for an insulator and different proximity sensing performance for a conductor. Exemplarily, FIG. 10 is a schematic diagram of proximity sensing performance of an interdigital bipolar electrode on an insulator according to an exemplary embodiment of this application, where a horizontal coordinate of a curve graph 1000 represents a distance between the insulator and the interdigital bipolar electrode, and a vertical coordinate represents a capacitance value of the interdigital bipolar electrode. FIG. 11 is a schematic diagram of proximity sensing performance of an interdigital bipolar electrode on a conductor according to an exemplary embodiment of this application, where a horizontal coordinate of a curve graph 1100 represents a distance between the conductor and the interdigital bipolar electrode, and a vertical coordinate represents a capacitance value of the interdigital bipolar electrode.

Figure 12:
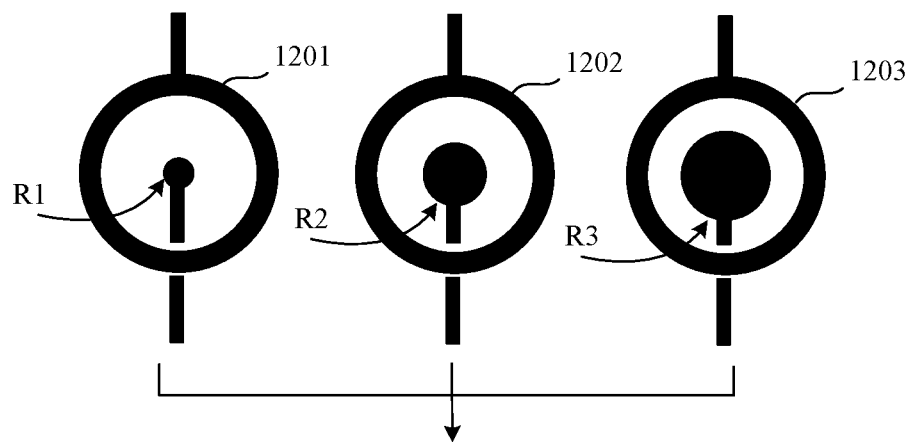
FIG. 12 is a schematic diagram of sensing performance of a concentric electrode according to an exemplary embodiment of this application.
Figure 12:
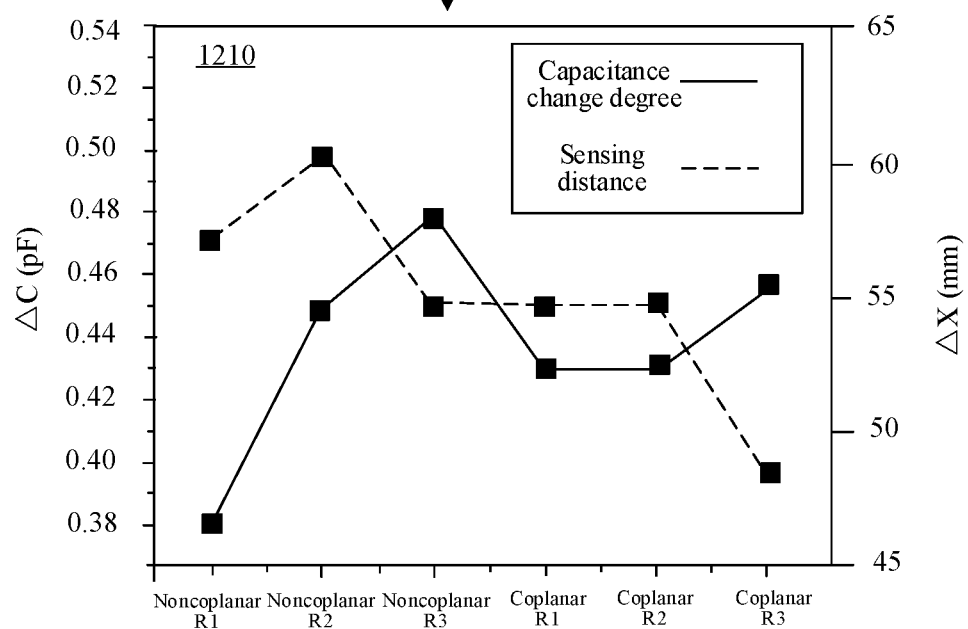

Second, the concentric electrode is described as follows:

The concentric electrode may be a coplanar concentric electrode, or may be a noncoplanar concentric electrode. In this embodiment of this application, description is made by using an example in which the concentric electrode is the coplanar concentric electrode. In some embodiments, the concentric electrode includes an outer circular frame and an inner circular piece. The outer circular frame is connected to a first pin, and the inner circular piece is connected to a second pin, where when the inner circular piece has a different size, the performance of a corresponding proximity sensor is also different. FIG. 12 is a schematic diagram of sensing performance of a concentric electrode according to an exemplary embodiment of this application. As shown in FIG. 12, a radius of an inner circular piece in the concentric electrode 1201 is R1, a radius of an inner circular piece in the concentric electrode 1202 is R2, and a radius of an inner circular piece in the concentric electrode 1203 is R3, where the radius R1 is less than the radius R2, the radius R2 is less than the radius R3, and it can be learned according to a broken line graph 1210 capacitance change degrees and sensing distances corresponding to the inner circular pieces with different radiuses.

Figure 13:
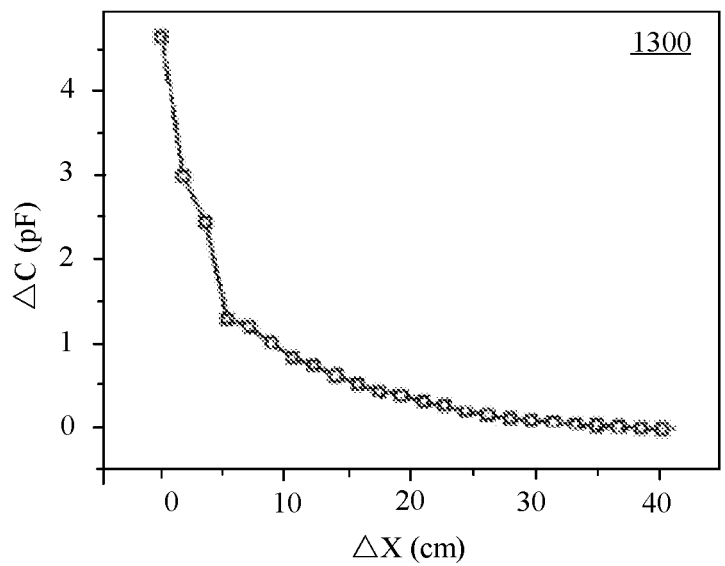
FIG. 13 is a schematic diagram of sensing performance of a frame-shaped unipolar electrode according to an exemplary embodiment of this application.

In some embodiments, FIG. 13 is a schematic diagram of sensing performance of a frame-shaped unipolar electrode according to an exemplary embodiment of this application. As shown in FIG. 13, a horizontal coordinate of a curve graph 1300 represents a distance between an object and the frame-shaped unipolar electrode, and a vertical coordinate represents a capacitance change degree of the unipolar electrode.

Figure 14:
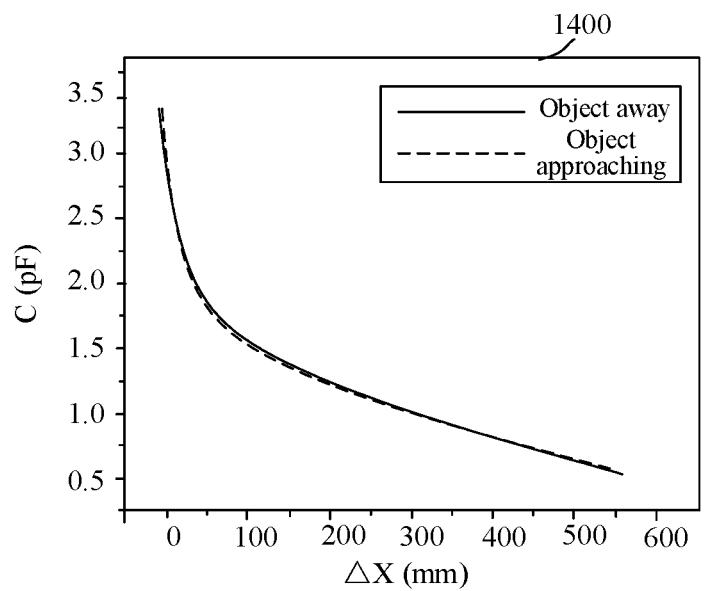
FIG. 14 is a schematic diagram of sensing stability of a frame-shaped unipolar electrode according to an exemplary embodiment of this application.

In some embodiments, FIG. 14 is a schematic diagram of sensing stability of a frame-shaped unipolar electrode according to an exemplary embodiment of this application.

As shown in FIG. 14, a horizontal coordinate of a curve graph 1400 represents a distance between an object and the frame-shaped unipolar electrode, and a vertical coordinate represents a capacitance value of the unipolar electrode.

In summary, in the flexible sensing system provided in this embodiment, two electrodes: a unipolar electrode and a bipolar electrode are disposed on a first electrode layer, a distance between a target object within a first distance range and a flexible sensing system is determined by using the bipolar electrode, and a distance between the target object within a second distance range and the flexible sensing system is determined by using the unipolar electrode. Therefore, different sensing solutions are used for the object at different distance positions, thereby avoiding that a single sensing solution has a relatively low sensing accuracy, and improving the sensing accuracy of the proximity sensor.

In the flexible sensing system provided in this embodiment, a distance and an orientation of an object within a first distance range is determined through n bipolar electrodes arranged in an array, and on the basis of determining a distance between the object and the bipolar electrode, a corresponding position of the object in the bipolar electrode may be further determined, thereby improving the sensing efficiency of a proximity sensor.

In the flexible sensing system provided in this embodiment, a sensing distance of the interdigital bipolar electrode is controlled by combining an interdigital feature of the interdigital bipolar electrode, thereby improving the sensing accuracy of a proximity sensor; and a sensing distance of the concentric electrode is controlled by combining a circular structure feature of the concentric electrode, thereby improving the sensing accuracy of the proximity sensor.

In some embodiments, the flexible sensing system may be implemented as a multi-level proximity sensor, and may further be implemented as a contact sensor. In some embodiments, the flexible sensing system further includes: a dielectric layer, a second electrode layer, and a second thin film encapsulation layer, where the second electrode layer is attached to the second thin film encapsulation layer, and the first thin film encapsulation layer, the first electrode layer, the dielectric layer, the second electrode layer, and the second thin film encapsulation layer are sequentially superimposed; and a contact sensing electric field is formed between the first electrode layer and the second electrode layer, and when the target object is in contact with the flexible sensing system, the contact sensing electric field is used for determining pressure between the target object and the flexible sensing system.

In some embodiments, the contact sensing electric field is used for determining a pressure position between the target object and the flexible sensing system, and the contact sensing electric field is used for determining a pressure value between the target object and the flexible sensing system.

Figure 15:
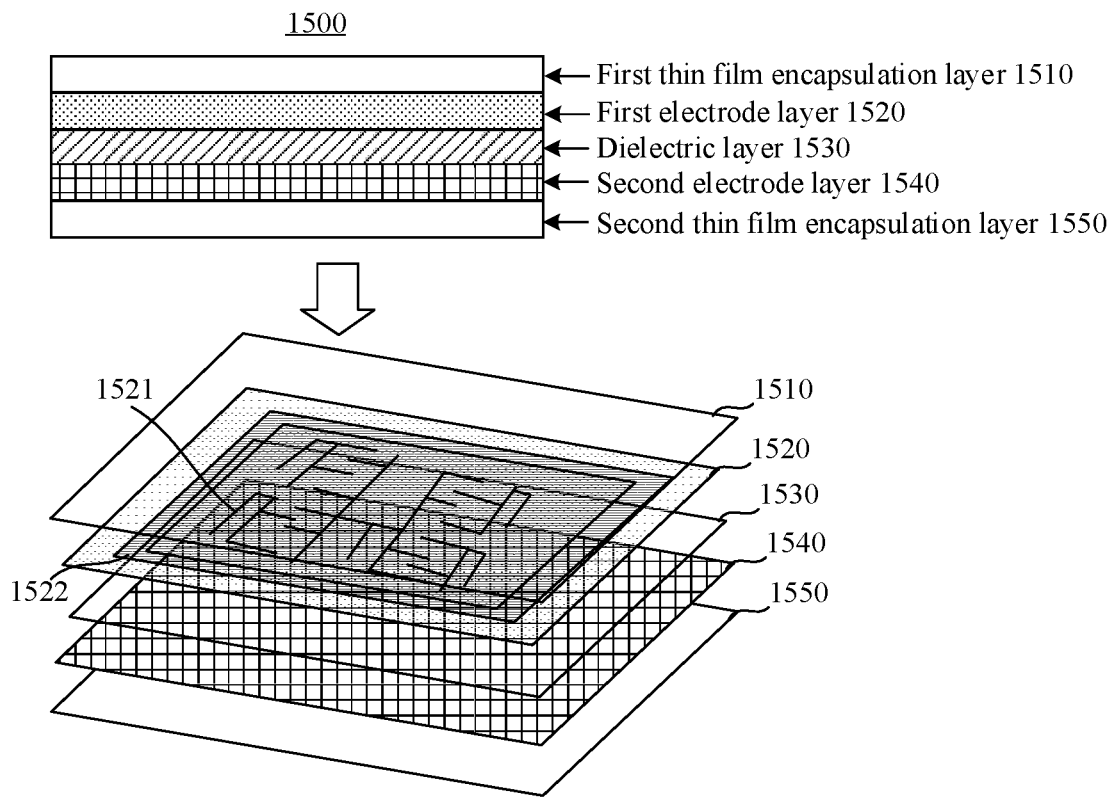
FIG. 15 is a schematic structural diagram of a flexible sensing system according to another exemplary embodiment of this application.

Exemplarily, referring to FIG. 15, the flexible sensing system 1500 includes a first thin film encapsulation layer 1510, a first electrode layer 1520, a dielectric layer 1530, a second electrode layer 1540, and a second thin film encapsulation layer 1550.

The first electrode layer 1520 is attached to the first thin film encapsulation layer 1510, and the first electrode layer 1520 includes a bipolar electrode 1521 and a unipolar electrode 1522. The structure of the first electrode layer 1520 has been described in detail in the foregoing embodiment, and details are not described herein again.

Each layer in the five-layer structures: the first thin film encapsulation layer 1510, the first electrode layer 1520, the dielectric layer 1530, the second electrode layer 1540, and the second thin film encapsulation layer 1550 are separately described as follows:

First thin film encapsulation layer 1510: It includes any one of a polymer thin film or a TPU film, where the polymer thin film may be a thin film made of a material such as polyethylene terephthalate (PET) or polyimide (PI).

First electrode layer 1520: It includes a bipolar electrode 1521 and a unipolar electrode 1522. The first electrode layer 1520 is attached to the first thin film encapsulation layer 1510, electrode materials of the bipolar electrode 1521 and the unipolar electrode 1522 on the first electrode layer 1520 include at least one of materials such as conductive carbon cloth, a conductive metal, and a silver nanowire, and the electrode material is attached to the first thin film encapsulation layer 1510 in an attachment, evaporation, printing, or spraying manner, where the conductive carbon cloth is attached to the first thin film encapsulation layer 1510 in an attachment manner, the conductive metal is attached to the first thin film encapsulation layer 1510 in an evaporation or printing manner, and the silver nanowire is attached to the first thin film encapsulation layer 1510 in a spraying manner.

The first electrode layer 1520 includes n bipolar electrodes 1521 arranged in an array and a frame-shaped unipolar electrode 1522 surrounding the n bipolar electrodes 1521. An arc-shaped electric field formed by the bipolar electrode 1521 is used for determining a position of a target object within a first distance range of the flexible sensing system and a distance between the target object and the flexible sensing system, and a vertical electric field formed by the unipolar electrode 1522 is used for determining a position of the target object within a second distance range of the flexible sensing system and a distance between the target object and the flexible sensing system, where the first distance range is less than the second distance range. In some embodiments, a position and a distance of the target object are first determined through the bipolar electrode 1521. When the object is out of the first distance range, the position and the distance of the target object are determined through the unipolar electrode 1522.

The bipolar electrode 1521 includes at least one of an interdigital bipolar electrode and a concentric electrode.

Figure 16:
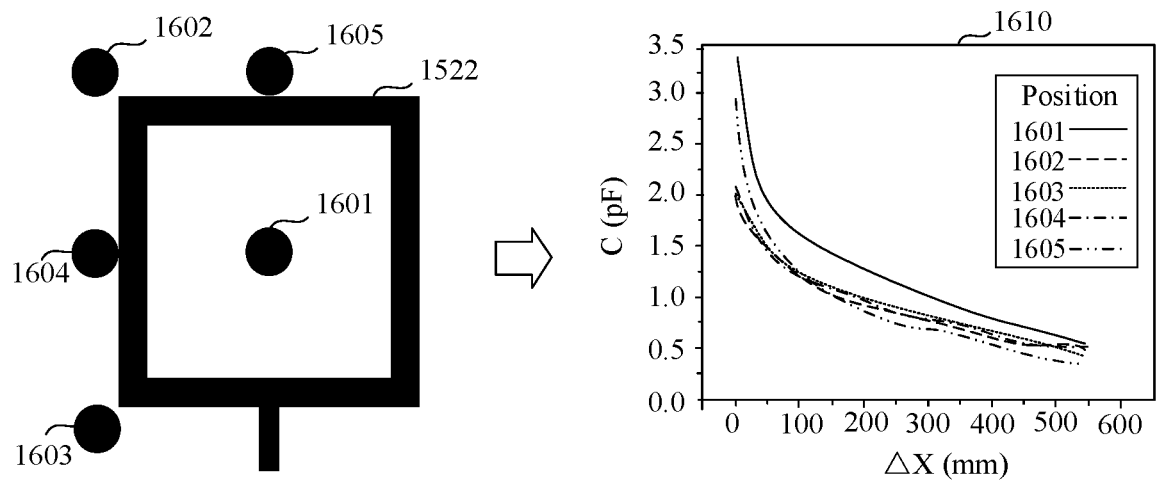
FIG. 16 is a schematic diagram of sensing performance of a target object approaching at different positions of a frame-shaped unipolar electrode according to an exemplary embodiment of this application.

The frame-shaped unipolar electrode 1522 surrounds a periphery of the bipolar electrode 1521, and when the target object approaches at different positions of the frame-shaped unipolar electrode 1522, the sensing performance of the frame-shaped unipolar electrode 1522 is different. Exemplarily, FIG. 16 is a schematic diagram of sensing performance of a target object approaching at different positions of a frame-shaped unipolar electrode 1522 according to an exemplary embodiment of this application. As shown in FIG. 16, the target object approaches the frame-shaped unipolar electrode 1522 at a position 1601, a position 1602, a position 1603, a position 1604, and a position 1605 respectively. A curve graph 1610 is used for reflecting the sensor performance stability corresponding to the five positions, where a horizontal coordinate of the curve graph 1610 is used for representing a distance change between the target object and the frame-shaped unipolar electrode 1522, and a vertical coordinate is used for representing a capacitance value of the frame-shaped unipolar electrode. FIG. 16 shows only the position 1601, the position 1602, the position 1603, the position 1604, and the position 1605, and the target object may approach the frame-shaped unipolar electrode 1522 at any position of the frame-shaped unipolar electrode 1522.

Figure 17:
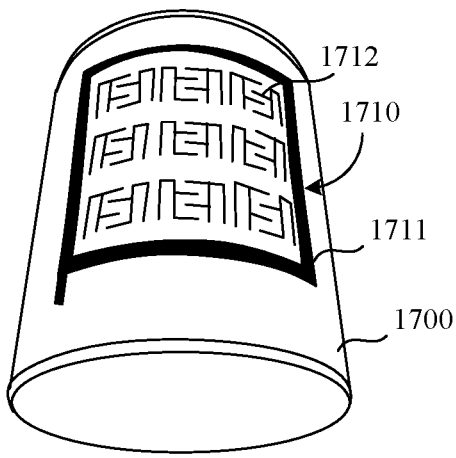
FIG. 17 shows an attachment manner of a multi-level proximity sensor formed by first electrode layers on a curved surface.

Exemplarily, FIG. 17 shows an attachment manner of a multi-level proximity sensor formed by first electrode layers 1520 on a curved surface. As shown in FIG. 17, a multi-level proximity sensor 1710 is attached to a surface of an object 1700. The multi-level proximity sensor 1710 includes a frame-shaped unipolar electrode 1711 and bipolar electrodes 1712 arranged in an array.

Dielectric layer 1530: It is used for maintaining the insulativity between the first electrode layer 1520 and the second electrode layer 1540. In some embodiments, the dielectric layer 1530 adopts an ion gel sensing material including a microstructure, or adopts an insulating material including a microstructure.

When the dielectric layer 1530 adopts the ion gel sensing material including the microstructure, the ion gel sensing material includes a polymer and an ionic liquid, and the ion gel sensing material has an ion sensing characteristic. The polymer may be implemented as poly(vinylidene fluoride-hexafluoro propylene) (P(VDF-HFP)), and the ionic liquid is implemented as 1-Ethyl-3-methylimidazolium bis(trifluoromethylsulfonyl)imide ([EMIM][TFSI]), where P(VDF-HFP) is a polymer skeleton, used for forming a stable network structure, [EMIM][TFSI] is an ionic liquid, attached to the polymer skeleton and serving as an active material for capacitive sensing. The dielectric layer 1530 is produced by using the ion gel sensing material, and production steps include: 1. dissolving P(VDF-HFP) in an acetone solution, a mass ratio of P(VDF-HFP) to acetone being 1:10, and stirring the solution by using magnets until the solution is clear; 2. adding [EMIM][TFSI] to a completely dissolved acetone solution, a mass ratio of [EMIM][TFSI] to P(VDF-HFP) being 3:1, and continuing to stir the solution by using the magnets until the solution is clear; and 3. pouring a mixed solution into a microstructure template, placing the template into a fume hood to allow the solution to volatilize naturally, and removing an ion gel thin film after an ion gel is cured, to obtain an ion gel thin film with a microstructure on a surface. A specific shape of the microstructure is not limited, a size of the microstructure is in a submillimeter level, and a thickness of the thin film is within a range of 10 μm to 200 μm. In some embodiments, the foregoing mass ratio of P(VDF-HFP) to the acetone may be any mass ratio between 1:1 and 1:20. Schematic description is made by using 1:10 as an example in this embodiment of this application; and the foregoing mass ratio of [EMIM][TFSI] to P(VDF-HFP) may be any mass ratio between 1:2 and 5:1. Schematic description is made by using 3:1 as an example in this embodiment of this application.

When the dielectric layer 1530 adopts the ion gel sensing material, the first electrode layer 1520 and the second electrode layer 1540 form a contact sensor of an ionic capacitance.

When the dielectric layer 1530 adopts the insulating material including the microstructure on the surface, the insulating material is implemented as a polydimethylsiloxane (PDMS) material. Exemplarily, production steps of the PDMS thin film include: obtaining a PDMS base liquid, and taking out a quantitative PDMS curing agent according to a mass ratio 10:1 of the PDMS base liquid to the PDMS curing agent, mixing and stirring the PDMS curing agent with the PDMS base liquid uniformly, removing bubbles by using a vacuum box to perform vacuum pumping, pouring a PDMS mixed solution into a microstructure template, placing the template on a horizontal table for natural curing or heating curing, and removing the PDMS thin film after PDMS curing, to obtain the PDMS thin film including the microstructure on the surface. In some embodiments, a specific shape of the microstructure is not limited, a size of the microstructure is in a submillimeter level, and a thickness of the thin film is within a range of 10 μm to 200 μm. In some embodiments, the foregoing mass ratio of the PDMS base liquid to the PDMS curing agent may be any mass ratio between 1:1 and 20:1. Schematic description is made by using 10:1 as an example in this embodiment of this application.

When the dielectric layer 1530 adopts an insulating material, the first electrode layer 1520 and the second electrode layer 1540 form a contact sensor of an electrostatic capacitance.

The sensing principle of the contact sensor of the ionic capacitance and the sensing principle of the contact sensor of the electrostatic capacitance are separately described. A calculation formula of the capacitance is shown in the following Formula 1:

$$C = \frac{\varepsilon S}{4\pi k d}, \quad \text{Formula 1}$$

C being a capacitance value of a capacitor, ε being a dielectric constant of an electrode material, S being an area of overlap between an electrode in the first electrode layer and an electrode in the second electrode layer, k being an electrostatic force constant, and d being a distance between the first electrode layer and the second electrode layer.

First, the sensing principle of the contact sensor of the ionic capacitance is as follows:

In the contact sensor of the ionic capacitance, the first electrode layer 1520 faces the second electrode layer 1540, an electric field between the first electrode layer and the second electrode layer may be approximated as a parallel electric field, the dielectric constant of the electrode material is not changed during sensing, there may be freely movable ions in the dielectric layer 1530, the ions move to the first electrode layer 1520 or the second electrode layer 1540 under the action of the electric field, and a capacitance, that is, an electric double layer capacitance is formed among the first electrode layer 1520, the second electrode layer 1540, and the dielectric layer 1530. In the electric double layer capacitance, S represents a contact area between the electrode and the dielectric layer 1530, a contact area between the electrode and the dielectric layer 1530 increases under the action of pressure, and a distance d between the electrode and the dielectric layer 1530 is in a nanometer level. Therefore, the capacitance value of the sensor increases with the increase of the contact area, thereby implementing the sensing function of the contact sensor of the ionic capacitance.

Second, the sensing principle of the contact sensor of the electrostatic capacitance is as follows:

In the contact sensor of the electrostatic capacitance, the first electrode layer 1520 faces the second electrode layer 1540, an electric field between the first electrode layer and the second electrode layer may be approximated as a parallel electric field, the dielectric constant of the electrode material is not changed during sensing, and an area of overlap between the first electrode layer 1520 and the second electrode layer 1540 is not changed either. Therefore, only a distance d between the first electrode layer 1520 and the second electrode layer 1540 is changed during sensing, and when the contact sensor of the electrostatic capacitance is subjected to a pressure event, the distance between the first electrode layer 1520 and the second electrode layer 1540 is decreased, and a capacitance value is increased, thereby implementing the sensing function of the contact sensor of the electrostatic capacitance.

Figure 18:
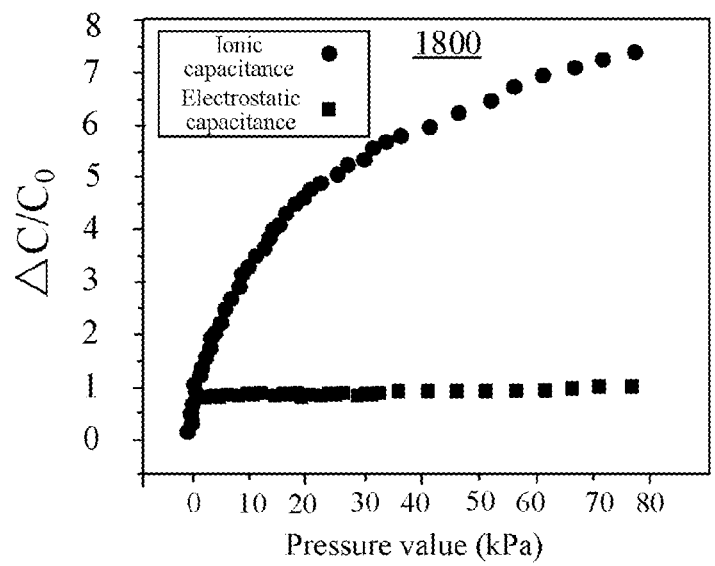
FIG. 18 is a schematic diagram of a sensitivity comparison between a contact sensor of an ionic capacitance and a contact sensor of an electrostatic capacitance according to an exemplary embodiment of this application.

Exemplarily, FIG. 18 is a schematic diagram of a sensitivity comparison between a contact sensor of an ionic capacitance and a contact sensor of an electrostatic capacitance according to an exemplary embodiment of this application. In a data distribution graph 1800 shown in FIG. 18, a horizontal coordinate of a coordinate system is used for representing a pressure value received by the contact sensor, and a vertical coordinate is used for representing a capacitance variation of the contact sensor.

Second electrode layer 1540: It is used for combining with the first electrode layer 1520 to form the contact sensor. In some embodiments, the second electrode layer 1540 includes an electrode sheet, and the first electrode layer 1520 falls within a sheet region of the electrode sheet. In some embodiments, the electrode sheet is a copper foil sheet. The electrode sheet is used as a lower electrode of the capacitive contact sensor, and is used as a shielding layer of the proximity sensor formed by the first electrode layers 1520. When the first electrode layer 1520 is located on a first side of the first electrode layer 1540, the second electrode layer 1540 is used for shielding electric field interference on a second side.

In some embodiments, the second electrode layer 1540 is attached to the second thin film encapsulation layer 1550. In some embodiments, the second electrode layer 1540 is attached to the second thin film encapsulation layer 1550 in an attachment manner.

Second thin film encapsulation layer 1550: It is used for encapsulating the second electrode layer 1540. In some embodiments, the second thin film encapsulation layer 1550 may be implemented as a polymer thin film made of a material such as polyethylene terephthalate (PET) or polyimide (PI), or may be implemented as a TPU thin film.

In summary, in the flexible sensing system provided in this embodiment, two electrodes: a unipolar electrode and a bipolar electrode are disposed on a first electrode layer, a distance between a target object within a first distance range and a flexible sensing system is determined by using the bipolar electrode, and a distance between the target object within a second distance range and the flexible sensing system is determined by using the unipolar electrode. Therefore, different sensing solutions are used for the object at different distance positions, thereby avoiding that a single sensing solution has a relatively low sensing accuracy, and improving the sensing accuracy of the proximity sensor.

In the flexible sensing system provided in this embodiment, a first electrode layer, a dielectric layer, and a second electrode layer are provided, and a pressure event received on the flexible sensing system is detected according to a contact sensing electric field between the first electrode layer and the second electrode layer, thereby implementing the function of the contact sensor. That is, a proximity sensor and the contact sensor are combined in a same flexible sensing system, which improves the sensing efficiency of the flexible sensing system.

Figure 19:
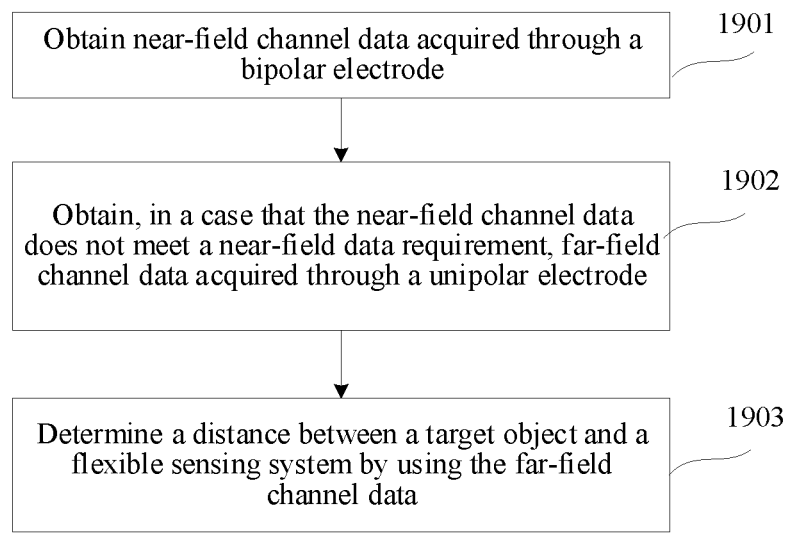
FIG. 19 is a flowchart of a proximity sensing method according to an exemplary embodiment of this application.

In some embodiments, FIG. 19 is a flowchart of a proximity sensing method according to an exemplary embodiment of this application. Description is made by using an example in which the method is applicable to a computer device including a flexible sensing system. The method includes the following steps:

Step 1901. Obtain near-field channel data acquired through a bipolar electrode.

In some embodiments, the bipolar electrode is an electrode in a first electrode layer of the flexible sensing system, and the first electrode layer further includes a unipolar electrode. An arc-shaped electric field formed by the bipolar electrode is used for determining a distance between a target object and the flexible sensing system within a first distance range. In some embodiments, the arc-shaped electric field is further used for determining a position of the target object. A vertical electric field formed by the unipolar electrode is used for determining a distance between the target object and the flexible sensing system within a second distance range. In some embodiments, the arc-shaped electric field is further used for determining a position of the target object, and the first distance range is less than the second distance range.

In some embodiments, the near-field channel data includes capacitance data of the bipolar electrode.

Step 1902. Obtain, when the near-field channel data does not meet a near-field data requirement, far-field channel data acquired through a unipolar electrode.

The near-field data requirement is a data requirement determined according to the first distance range. Exemplarily, the near-field data is data acquired within the first distance range.

When the near-field channel data does not meet the near-field data requirement, it indicates that the target object is not located within the first distance range. Therefore, far-field channel data is acquired through the unipolar electrode.

Exemplarily, the near-field data includes capacitance data of the bipolar electrode. When the capacitance data is not greater than a preset capacitance threshold, far-field channel data acquired through the unipolar electrode is obtained.

When the near-field channel data meets the near-field data requirement, it indicates that a current target object is located within the first distance range of the flexible sensing system. Therefore, a distance and an orientation of the target object are determined by using the near-field channel data. When the capacitance data of the bipolar electrode is greater than the preset capacitance threshold, it is determined that the near-field channel data meets the near-field data requirement.

The far-field channel data includes capacitance data of the unipolar electrode.

In some embodiments, the flexible sensing system further includes a second electrode layer and a dielectric layer. The dielectric layer is located between the first electrode layer and the second electrode layer, and a contact sensing electric field is formed between the first electrode layer and the second electrode layer. Before it is determined between the near-field channel data and the near-field data requirement, the near-field channel data is compared with a contact data requirement.

When the near-field channel data meets the contact data requirement, a contact event between the target object and the flexible sensing system is determined by using contact electric field data generated by the contact sensing electric field. The contact event includes a position at which the contact event is generated on the flexible sensing system, and a pressure value of the contact event.

The contact data requirement includes a preset contact capacitance value. When the near-field channel data is greater than the preset contact capacitance value, it is determined that there is the contact event between the target object and the flexible sensing system.

Step 1903. Determine a distance between a target object and a flexible sensing system by using the far-field channel data.

According to the capacitance data of the unipolar electrode, an orientation of an object that is located within the second distance range but is not located within the first distance range is determined.

Exemplarily, when the far-field channel data meets a far-field data requirement, an orientation of the target object is determined by using the far-field channel data, the far-field data requirement being a data requirement determined according to the second distance range.

The far-field data requirement includes a preset far-field capacitance. When the far-field channel data is less than the preset far-field capacitance, it is determined that the far-field channel data meets the far-field data requirement, and an orientation of the target object is determined by using the far-field channel data.

In some embodiments, when the far-field channel data does not meet the far-field data requirement, near-field channel data acquired through the bipolar electrode continues to be obtained.

In summary, in the proximity sensing method provided in this embodiment, two electrodes: a unipolar electrode and a bipolar electrode are disposed on a first electrode layer, a distance between a target object within a first distance range and a flexible sensing system is determined by using the bipolar electrode, and a distance between the target object within a second distance range and the flexible sensing system is determined by using the unipolar electrode. Therefore, different sensing solutions are used for the object at different distance positions, thereby avoiding that a single sensing solution has a relatively low sensing accuracy, and improving the sensing accuracy of the proximity sensor.

Figure 20:
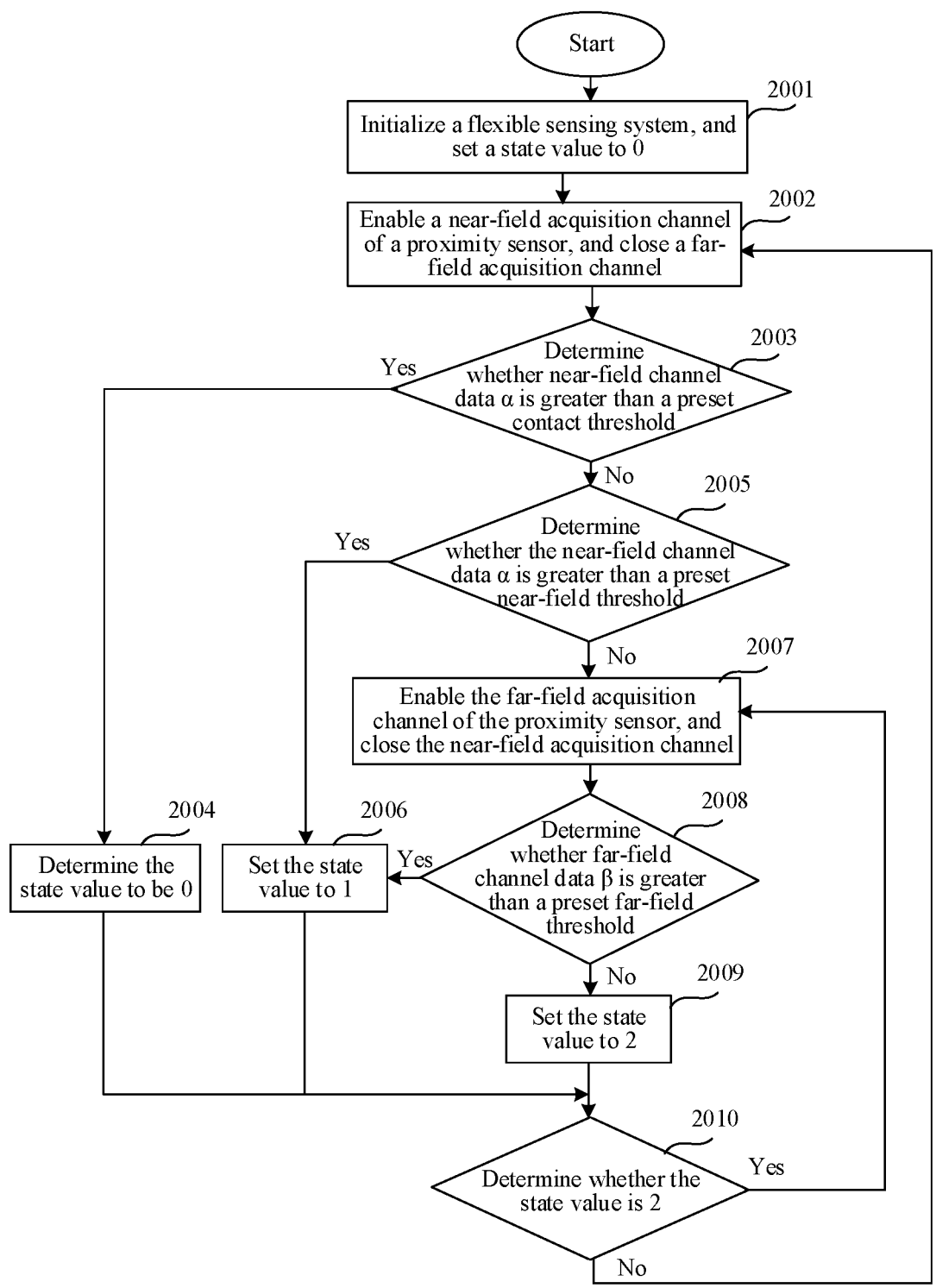
FIG. 20 is a diagram of an application procedure of a flexible sensing system according to an exemplary embodiment of this application.

FIG. 20 is a diagram of an application procedure of a flexible sensing system according to an exemplary embodiment of this application. As shown in FIG. 20, the application procedure includes the following steps:

Step 2001. Initialize a flexible sensing system, and set a state value to 0.

In some embodiments, the state value 0 is used for indicating that a target object is in contact with the flexible sensing system.

Step 2002. Enable a near-field acquisition channel of a proximity sensor, and close a far-field acquisition channel.

The proximity sensor includes a unipolar electrode and a bipolar electrode. A vertical electric field generated by the unipolar electrode is used for acquiring far-field channel data, and an arc-shaped electric field generated by the bipolar electrode is used for acquiring near-field channel data. In some embodiments, after the flexible sensing system is initialized, the near-field acquisition channel is enabled and the far-field acquisition channel is closed. That is, the bipolar electrode is powered on, to generate an arc-shaped electric field for acquiring the near-field channel data, and the unipolar electrode is powered off Step 2003. Determine whether near-field channel data a is greater than a preset contact threshold.

Step 2004. When the near-field channel data a is greater than the preset contact threshold, determine the state value to be 0.

In some embodiments, when the near-field channel data a is greater than the preset contact threshold, it is determined that the target object is in contact with the flexible sensing system, and the state value is determined to be 0.

Step 2005. When the near-field channel data a is not greater than the preset contact threshold, determine whether the near-field channel data a is greater than a preset near-field threshold.

In some embodiments, when the near-field channel data a is not greater than the preset contact threshold, it is determined that the target object is not in contact with the flexible sensing system, and whether the target object is currently located in a near-field region range or in a far-field region range continues to be determined.

Step 2006. When the near-field channel data a is greater than the preset near-field threshold, set the state value to 1.

In some embodiments, when the near-field channel data a is greater than the preset near-field threshold, it is determined that the target object is located within the near-field region range, and therefore the state value is set to 1.

Step 2007. When the near-field channel data a is not greater than the preset near-field threshold, enable the far-field acquisition channel of the proximity sensor, and close the near-field acquisition channel.

In some embodiments, when the near-field channel data a is not greater than a near-field contact threshold, the far-field channel data is acquired for further determining.

In some embodiments, the proximity sensor includes a unipolar electrode and a bipolar electrode. A vertical electric field generated by the unipolar electrode is used for acquiring far-field channel data, and an arc-shaped electric field generated by the bipolar electrode is used for acquiring near-field channel data. In some embodiments, when the near-field channel data a is not greater than the near-field contact threshold, the far-field acquisition channel is enabled and the near-field acquisition channel is closed. That is, the unipolar electrode is powered on, to generate a vertical electric field for acquiring the far-field channel data, and the bipolar electrode is powered off Step 2008. Determine whether far-field channel data β is greater than a preset far-field threshold.

Step 2009. When the far-field channel data β is not greater than the preset far-field threshold, set the state value to 2.

In some embodiments, when the far-field channel data β is greater than the preset far-field threshold, determine that the target object is located within the near-field region range, and set the state value to 1.

In some embodiments, when the far-field channel data β is not greater than the preset far-field threshold, determine that the target object is located within the far-field region range, and set the state value to 2.

Step 2010. Determine whether the state value is 2, and when the state value is 2, repeatedly perform step 2002; or when the state value is not 2, repeatedly perform step 2007.

In summary, in the flexible sensing system provided in this embodiment, two electrodes: a unipolar electrode and a bipolar electrode are disposed on a first electrode layer, a position of an object within a first distance range is determined by using the bipolar electrode, and a position of the object within a second distance range is determined by using the unipolar electrode. Therefore, different sensing solutions are used for the object at different distance positions, thereby avoiding that a single sensing solution has a relatively low sensing accuracy, and improving the sensing accuracy of the proximity sensor.

Figure 21:
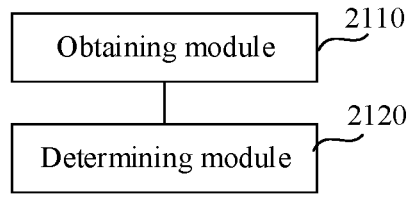
FIG. 21 is a structural block diagram of a proximity sensing apparatus according to an exemplary embodiment of this application.

In some embodiments, FIG. 21 is a structural block diagram of a proximity sensing apparatus according to an exemplary embodiment of this application. As shown in FIG. 21, the apparatus includes: an obtaining module 2110 and a determining module 2120.

The obtaining module 2110 is configured to obtain near-field channel data acquired through a bipolar electrode, the bipolar electrode being an electrode in a first electrode layer of a flexible sensing system, the first electrode layer further including a unipolar electrode, an arc-shaped electric field formed by the bipolar electrode being used for determining a distance between a target object and the flexible sensing system within a first distance range, a vertical electric field formed by the unipolar electrode being used for determining a distance between the target object and the flexible sensing system within a second distance range, and the first distance range being less than the second distance range.

The obtaining module 2110 is further configured to obtain, when the near-field channel data does not meet a near-field data requirement, far-field channel data acquired through the unipolar electrode, the near-field data requirement being a data requirement determined according to the first distance range.

The determining module 2120 is configured to determine a distance between the target object and the flexible sensing system by using the far-field channel data.

In some embodiments, the determining module 2120 is further configured to determine, when the far-field channel data meets a far-field data requirement, a distance between the target object and the flexible sensing system by using the far-field channel data, the far-field data requirement being a data requirement determined according to the second distance range.

In some embodiments, the obtaining module 2110 is further configured to obtain, when the far-field channel data does not meet the far-field data requirement, the near-field channel data acquired through the bipolar electrode.

In some embodiments, the determining module 2120 is further configured to determine, when the near-field channel data meets the near-field data requirement, a distance between the target object and the flexible sensing system by using the near-field channel data.

In some embodiments, the flexible sensing system further includes a second electrode layer and a dielectric layer. The dielectric layer is located between the first electrode layer and the second electrode layer, and a contact sensing electric field is formed between the first electrode layer and the second electrode layer.

The determining module 2120 is further configured to determine, when the near-field channel data meets the contact data requirement, a contact event between the target object and the flexible sensing system by using contact electric field data generated by the contact sensing electric field.

In summary, in the proximity sensing apparatus provided in this embodiment, two electrodes: a unipolar electrode and a bipolar electrode are disposed on a first electrode layer, a position of an object within a first distance range is determined by using the bipolar electrode, and a position of the object within a second distance range is determined by using the unipolar electrode. Therefore, different sensing solutions are used for the object at different distance positions, thereby avoiding that a single sensing solution has a relatively low sensing accuracy, and improving the sensing accuracy of the proximity sensor. In this application, the term "unit" or "module" refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

Figure 22:
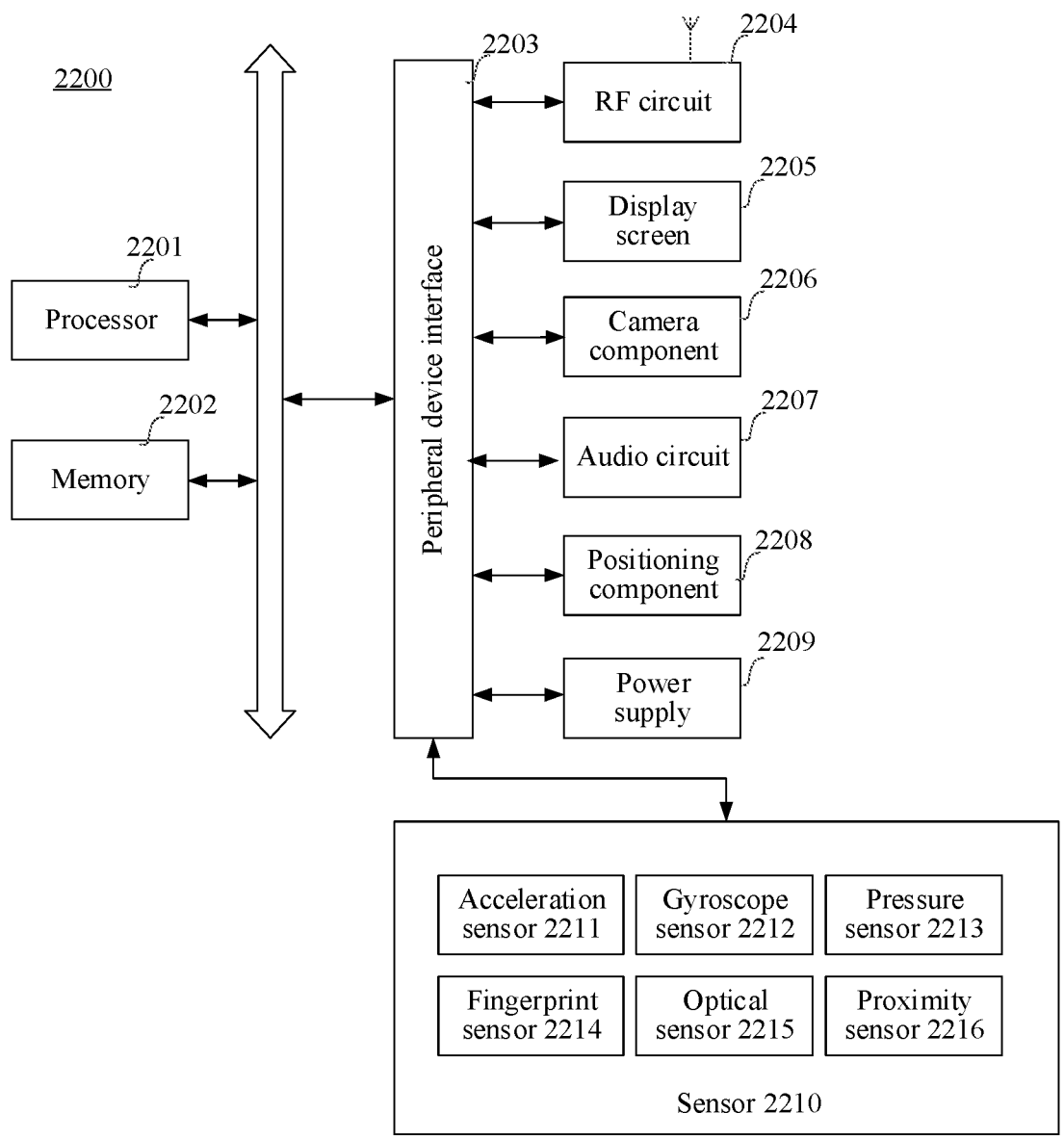
FIG. 22 is a structural block diagram of a terminal according to an exemplary embodiment of this application.

FIG. 22 is a structural block diagram of a terminal 2200 according to an exemplary embodiment of the present disclosure. The terminal 2200 may be a smartphone, a tablet computer, a moving picture experts group audio layer III (MP3) player, a moving picture experts group audio layer IV (MP4) player, a notebook computer, or a desktop computer. The terminal 2200 may also be referred to other names such as a user device, or a portable terminal, a laptop computer, or a desktop terminal.

Generally, the terminal 2200 includes a processor 2201 and a memory 2202.

The processor 2201 may include one or more processing cores, for example, a 4-core processor or an 8-core processor. The processor 2201 may be implemented in at least one hardware form of digital signal processing (DSP), a field programmable gate array (FPGA), and a programmable logic array (PLA). The processor 2201 may alternatively include a main processor and a coprocessor. The main processor is a processor configured to process data in an active state, and is also referred to as a central processing unit (CPU). The coprocessor is a low-power processor configured to process data in a standby state. In some embodiments, the processor 2201 may be integrated with a graphics processing unit (GPU). The GPU is configured to render and draw content that needs to be displayed on a display screen. In some embodiments, the processor 2201 may further include an artificial intelligence (AI) processor. The AI processor is configured to process computing operations related to machine learning.

The memory 2202 may include one or more computer-readable storage media. The computer-readable storage media may be non-transient. The memory 2202 may further include a high-speed random access memory (RAM) and a non-volatile memory, for example, one or more disk storage devices or flash memory devices. In some embodiments, a non-transitory computer-readable storage medium in the memory 2202 is configured to store at least one instruction, the at least one instruction being configured to be executed by the processor 2201 to implement the proximity sensing method provided in the method embodiments of this application.

In some embodiments, the terminal 2200 may optionally include a peripheral device interface 2203 and at least one peripheral device. The processor 2201, the memory 2202, and the peripheral device interface 2203 may be connected through a bus or a signal cable. Each peripheral device may be connected to the peripheral device interface 2203 through a bus, a signal cable, or a circuit board. Specifically, the peripheral device includes: at least one of a radio frequency (RF) circuit 2204, a touch display screen 2205, a camera component 2206, an audio circuit 2207, a positioning component 2208, and a power supply 2209.

The peripheral device interface 2203 may be configured to connect at least one peripheral device related to input/output (I/O) to the processor 2201 and the memory 2202. In some embodiments, the processor 2201, the memory 2202, and the peripheral device interface 2203 are integrated on a same chip or circuit board. In some other embodiments, any or both of the processor 2201, the memory 2202, and the peripheral device interface 2203 may be implemented on an independent chip or circuit board. This is not limited in this embodiment.

The RF circuit 2204 is configured to receive and transmit a RF signal, also referred to as an electromagnetic signal. The RF circuit 2204 communicates with a communication network and other communication devices through the electromagnetic signal. The RF circuit 2204 may convert an electric signal into an electromagnetic signal for transmission, or convert a received electromagnetic signal into an electric signal. In some embodiments, the RF circuit 2204 includes: an antenna system, an RF transceiver, one or more amplifiers, a tuner, an oscillator, a digital signal processor, a codec chip set, a subscriber identity module card, and the like. The RF circuit 2204 may communicate with another terminal by using at least one wireless communication protocol. The wireless communication protocol includes, but is not limited to: a world wide web, a metropolitan area network, an intranet, generations of mobile communication networks (2G, 3G, 4G, and 5G), a wireless local area network, and/or a wireless fidelity (Wi-Fi) network. In some embodiments, the RF circuit 2204 may further include a circuit related to near field communication (NFC), which is not limited in this application.

The display screen 2205 is configured to display a user interface (UI). The UI may include a graphic, a text, an icon, a video, and any combination thereof. When the display screen 2205 is a touchscreen, the display screen 2205 is further capable of acquiring a touch signal on or above a surface of the display screen 2205. The touch signal may be inputted into the processor 2201 as a control signal for processing. In this case, the display screen 2205 may be further configured to provide a virtual button and/or a virtual keyboard, also referred to as a soft button and/or a soft keyboard. In some embodiments, there may be one display screen 2205, disposed on a front panel of the terminal 2200. In other embodiments, there may be at least two display screens 2205, respectively disposed on different surfaces of the terminal 2200 or folded. In still other embodiments, the display screen 2205 may be a flexible display screen, disposed on a curved surface or a folded surface of the terminal 2200. Even, the display screen 2205 may be further set in a non-rectangular irregular pattern, that is, a special-shaped screen. The display screen 2205 may be manufactured by using a material such as a liquid crystal display (LCD), an organic light-emitting diode (OLED), or the like.

The camera component 2206 is configured to acquire images or videos. In some embodiments, the camera component 2206 includes a front-facing camera and a rear-facing camera. Generally, the front-facing camera is disposed on a front panel of the terminal, and the rear-facing camera is disposed on a back surface of the terminal. In some embodiments, there are at least two rear-facing cameras, which are respectively any one of a main camera, a depth-of-field camera, a wide-angle camera, and a telephoto camera, to achieve background blurring function through fusion of the main camera and the depth-of-field camera, panoramic photographing and virtual reality (VR) photographing function through fusion of the main camera and the wide-angle camera, or other fusion photographing functions. In some embodiments, the camera component 2206 may further include a flash. The flash may be a single color temperature flash, or may be a double color temperature flash. The double color temperature flash refers to a combination of a warm flash and a cold flash, and may be used for light compensation at different color temperatures.

The audio circuit 2207 may include a microphone and a speaker. The microphone is configured to acquire sound waves of a user and an environment, and convert the sound waves into electrical signals and input the electrical signals into the processor 2201 for processing, or input the electrical signals into the RF circuit 2204 to implement voice communication. For stereo acquisition or noise reduction, there may be a plurality of microphones, disposed at different portions of the terminal 2200 respectively. The microphone may be further an array microphone or an omnidirectional acquisition microphone. The speaker is configured to convert electric signals from the processor 2201 or the RF circuit 2204 into sound waves. The speaker may be a conventional thin-film speaker or a piezoelectric ceramic speaker. When the speaker is the piezoelectric ceramic speaker, electric signals not only can be converted into sound waves that can be heard by human, but also can be converted into sound waves that cannot be heard by human for ranging and the like. In some embodiments, the audio circuit 2207 may also include an earphone jack.

The positioning component 2208 is configured to position a current geographic location of the terminal 2200, to implement a navigation or a location based service (LBS). The positioning component 2208 may be a positioning component based on the Global Positioning System (GPS) of the United States, the BeiDou system of China, or the GALILEO System of Russia.

The power source 2209 is configured to supply power for components in the terminal 2200. The power supply 2209 may be an alternating-current power supply, a direct-current power supply, a disposable battery, or a rechargeable battery. When the power supply 2209 includes a rechargeable battery, and the rechargeable battery may be a wired rechargeable battery or a wireless rechargeable battery. The wired charging battery is a battery charged through a wired line, and the wireless charging battery is a battery charged through a wireless coil. The rechargeable battery may be further configured to support a quick charge technology.

In some embodiments, the terminal 2200 may further include one or more sensors 2210. The one or more sensors 2210 include, but are not limited to: an acceleration sensor 2211, a gyroscope sensor 2212, a pressure sensor 2213, a fingerprint sensor 2214, an optical sensor 2215, and a proximity sensor 2216.

The acceleration sensor 2211 may detect a magnitude of acceleration on three coordinate axes of a coordinate system established with the terminal 2200. For example, the acceleration sensor 2211 may be configured to detect components of gravity acceleration on the three coordinate axes. The processor 2201 may control, according to a gravity acceleration signal acquired by the acceleration sensor 2211, the display screen 2205 to display the user interface in a frame view or a portrait view. The acceleration sensor 2211 may be further configured to acquire motion data of a game or a user.

The gyroscope sensor 2212 may detect a body direction and a rotation angle of the terminal 2200, and may work with the acceleration sensor 2211 to acquire a 3D action performed by the user on the terminal 2200. The processor 2201 may implement the following functions according to data acquired by the gyroscope sensor 2212: motion sensing (for example, changing the UI according to a tilt operation of a user), image stabilization during shooting, game control, and inertial navigation.

The pressure sensor 2213 may be disposed at a side frame of the terminal 2200 and/or a lower layer of the display screen 2205. When the pressure sensor 2213 is disposed at the side frame of the terminal 2200, a holding signal of the user on the terminal 2200 may be detected. The processor 2201 performs left and right hand recognition or a quick operation according to the holding signal acquired by the pressure sensor 2213. When the pressure sensor 2213 is disposed on the low layer of the display screen 2205, the processor 2201 controls an operable control on the UI according to a pressure operation of the user on the display screen 2205. The operable control includes at least one of a button control, a scroll bar control, an icon control, and a menu control.

The fingerprint sensor 2214 is configured to acquire a user's fingerprint. The processor 2201 identifies a user's identity according to the fingerprint acquired by the fingerprint sensor 2214, or identifies the user's identity according to the fingerprint acquired by the fingerprint sensor 2214. When the user's identity is identified as a trusted identity, the processor 2201 authorizes the user to perform a related sensitive operation. The sensitive operation includes unlocking a screen, viewing encrypted information, downloading software, payment, changing settings, and the like. The fingerprint sensor 2214 may be disposed on a front surface, a back surface, or a side surface of the terminal 2200. When a physical button or a vendor logo is disposed on the terminal 2200, the fingerprint sensor 2214 may be integrated together with the physical button or the vendor logo.

The optical sensor 2215 is configured to acquire ambient light intensity. In an embodiment, the processor 2201 may acquire display luminance of the display screen 2205 according to the ambient light intensity acquired by the optical sensor 2215. Specifically, when the ambient light intensity is relatively high, the display brightness of the display screen 2205 is increased; and when the ambient light intensity is relatively low, the display brightness of the display screen 2205 is reduced. In another embodiment, the processor 2201 may further dynamically adjust a photographing parameter of the camera assembly 2206 according to the ambient light intensity acquired by the optical sensor 2215.

The proximity sensor 2216, also referred to as a distance sensor, is generally disposed at the front panel of the terminal 2200. The proximity sensor 2216 is configured to acquire a distance between the user and the front surface of the terminal 2200. In an embodiment, when the proximity sensor 2216 detects that the distance between the user and the front surface of the terminal 2200 gradually becomes small, the display screen 2205 is controlled by the processor 2201 to switch from a screen-on state to a screen-off state. When the proximity sensor 2216 detects that the distance between the user and the front surface of the terminal 2200 gradually becomes large, the touch display screen 2205 is controlled by the processor 2201 to switch from the screen-off state to the screen-on state.

A person skilled in the art may understand that the structure shown in FIG. 22 does not constitute a limitation on the terminal 2200, and the terminal may include more components or fewer components than those shown in the figure, or some components may be combined, or a different component deployment may be used.

Figure 23:
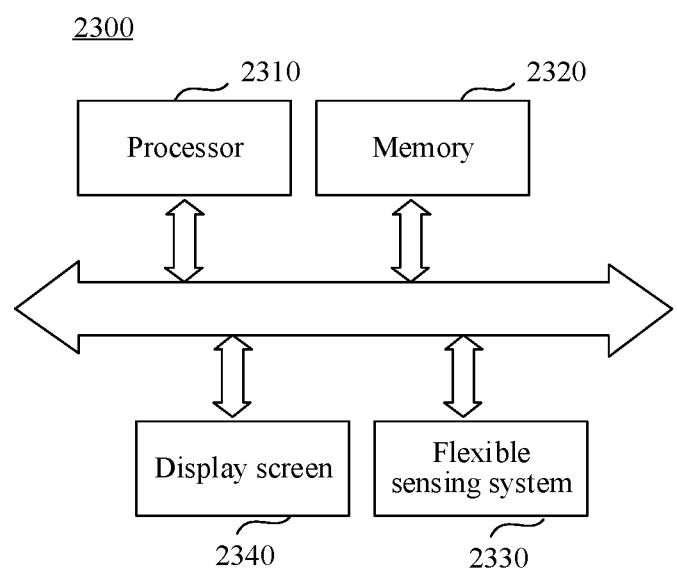
FIG. 23 is a structural block diagram of an intelligent robot according to an exemplary embodiment of this application.

FIG. 23 is a structural block diagram of an intelligent robot according to an exemplary embodiment of this application. The flexible sensing system shown in FIG. 5 or FIG. 15 is attached to a preset skin position on a surface of the intelligent robot 2300.

In some embodiments, the intelligent robot 2300 includes a processor 2310, a memory 2320, and a flexible sensing system 2330. In some embodiments, the intelligent robot 2300 further includes a display screen 2340.

In some embodiments, the intelligent robot 2300 includes skin positions with relatively small areas such as fingers and toes, and skin positions with relatively large areas such as arms, an abdomen, and a back. At the skin positions with relatively small areas, capacitive sensors with relatively low density and a small quantity are attached, and at the skin positions with relatively large areas, capacitive sensors with relatively high density are attached.

The memory 2320 stores at least one instruction, at least one program, a code set, or an instruction set, the at least one instruction, the at least one program, the code set, or the instruction set being loaded and executed by a processor 2310 to implement the distance sensing function implemented by using the foregoing flexible sensing system.

In some embodiments, the computer-readable storage medium may include: a read-only memory (ROM), a RAM, a solid state drive (SSD), an optical disc, or the like. The RAM may include a resistance random access memory (ReRAM) and a dynamic random access memory (DRAM). The sequence numbers of the foregoing embodiments of this application are merely for description purposes, and are not intended to indicate priorities of the embodiments.

In another aspect, a computer device is provided, including a processor and a memory, the memory storing at least one instruction, at least one program, a code set, or an instruction set, the at least one instruction, the at least one program, the code set, or the instruction set being loaded and executed by the processor to implement the proximity sensing method involved in the foregoing embodiments of this application.

In another aspect, a computer program product or a computer program is provided, including computer instructions, the computer instructions being stored in a computer-readable storage medium. A processor of a computer device reads the computer instructions from the computer-readable storage medium, and the processor executes the computer instructions, to cause the computer device to perform any proximity sensing method in the foregoing embodiments.

A person of ordinary skill in the art may understand that all or some of the steps of the foregoing embodiments may be implemented by hardware, or may be implemented a program instructing related hardware. The program may be stored in a computer-readable storage medium. The storage medium may be a ROM, a magnetic disk, or an optical disc, or the like.

The foregoing descriptions are merely embodiments of this application, but are not intended to limit this application. Any modification, equivalent replacement, or improvement made within the spirit and principle of this application falls within the protection scope of this application.

What is claimed is:
1. A flexible sensing system, comprising:
a first thin film encapsulation layer and a first electrode layer attached to the first thin film encapsulation layer;
the first electrode layer comprising a bipolar electrode having dual polarities, wherein the bipolar electrode is configured to, when a target object approaches the flexible sensing system, form an arc-shaped electric field for determining whether a distance between the target object and the flexible sensing system is within a first distance range;
the first electrode layer further comprising a unipolar electrode having a single polarity, wherein the unipolar electrode is configured to, when the target object approaches the flexible sensing system, form a vertical electric field for determining whether the distance between the target object and the flexible sensing system is within a second distance range; and the first distance range being less than the second distance range.

2. The flexible sensing system according to claim 1, wherein the first electrode layer comprises a bipolar electrode array comprising n bipolar electrodes, n being a positive integer; and the unipolar electrode comprises a frame-shaped unipolar electrode defining a hollow region, and the bipolar electrode array being within the hollow region of the frame-shaped unipolar electrode.

3. The flexible sensing system according to claim 2, wherein the n bipolar electrodes comprise at least one interdigital bipolar electrode or the n bipolar electrodes comprise at least one concentric electrode.

4. The flexible sensing system according to claim 1, further comprising: a dielectric layer, a second electrode layer, and a second thin film encapsulation layer, wherein the second electrode layer is attached to the second thin film encapsulation layer, and the first thin film encapsulation layer, the first electrode layer, the dielectric layer, the second electrode layer, and the second thin film encapsulation layer are sequentially superimposed; and the first electrode layer and the second electrode layer are configured to, when the target object is in contact with the flexible sensing system, form a contact sensing electric field for determining a pressure between the target object and the flexible sensing system.

5. The flexible sensing system according to claim 4, wherein the second electrode layer comprises an electrode sheet, and the first electrode layer being within a sheet region of the electrode sheet.

6. The flexible sensing system according to claim 5, wherein the electrode sheet is a copper foil sheet.

7. The flexible sensing system according to claim 4, wherein the dielectric layer adopts an ion gel sensing material comprising a microstructure, the ion gel sensing material comprises a polymer and an ionic liquid, and the ion gel sensing material has an ion sensing characteristic;

or the dielectric layer adopts an insulating material comprising a microstructure.

8. The flexible sensing system according to claim 4, wherein the second thin film encapsulation layer comprises any one of a polymer thin film or a TPU thin film.

9. The flexible sensing system according to claim 1, wherein the first electrode layer comprises conductive carbon cloth as an electrode material, and the conductive carbon cloth is attached to the first thin film encapsulation layer;

or the first electrode layer comprises a conductive metal as an electrode material, and the conductive metal is evaporated on the first thin film encapsulation layer;

or the first electrode layer comprises a silver nanowire as an electrode material, and the silver nanowire is sprayed on the first thin film encapsulation layer.

10. The flexible sensing system according to claim 1, wherein the first thin film encapsulation layer comprises any one of a polymer thin film or a thermoplastic polyurethanes (TPU) thin film.

11. A proximity sensing method performed by a computer device in connection with the flexible sensing system according to claim 1, the method comprising:

obtaining near-field channel data acquired through the bipolar electrode of the flexible sensing system;

obtaining, when the near-field channel data does not meet a near-field data requirement, far-field channel data acquired through the unipolar electrode of the flexible sensing system, the near-field data requirement being a data requirement determined according to the first distance range; and determining a distance between the target object and the flexible sensing system by using the far-field channel data.

12. A computer device, comprising a processor and a memory, the memory storing at least one instruction, the at least one instruction, when being loaded and executed by the processor, causing the computer device to implement the proximity sensing method according to claim 11.

13. A non-transitory computer-readable storage medium, storing at least one instruction, the at least one instruction, when being loaded and executed by a processor of a computer device, causing the computer device to implement the proximity sensing method according to claim 11.

14. An intelligent robot, comprising the flexible sensing system according to claim 1, the flexible sensing system being attached to a preset position on a surface of the intelligent robot.

* * * * *